US012581621B1

(12) United States Patent
Swatko

(10) Patent No.: US 12,581,621 B1
(45) Date of Patent: Mar. 17, 2026

(54) HIGH DENSITY COMPUTER COOLING SYSTEM

(71) Applicant: Zoox, Inc., Foster City, CA (US)

(72) Inventor: Nicholas John Swatko, Foster City, CA (US)

(73) Assignee: Zoox, Inc., Foster City, CA (US)

( * ) Notice: Subject to any disclaimer, the term of this patent is extended or adjusted under 35 U.S.C. 154(b) by 212 days.

(21) Appl. No.: 18/385,687

(22) Filed: Oct. 31, 2023

(51) Int. Cl.
| | |
|---|---|
| *H05K 7/20* | (2006.01) |
| *B60W 50/14* | (2020.01) |
| *H01M 10/613* | (2014.01) |
| *H01M 10/625* | (2014.01) |
| *H01M 10/6556* | (2014.01) |
| *H01M 10/656* | (2014.01) |

(52) U.S. Cl.
CPC ......... *H05K 7/20272* (2013.01); *B60W 50/14* (2013.01); *H01M 10/613* (2015.04); *H01M 10/625* (2015.04); *H01M 10/6556* (2015.04); *H01M 10/656* (2015.04); *B60W 2050/146* (2013.01); *H01M 2220/20* (2013.01)

(58) Field of Classification Search
CPC ............ H05K 7/20272; H01M 10/613; H01M 10/625; H01M 10/6556; H01M 10/656; H01M 2220/20; B60W 50/14; B60W 2050/146
USPC ........................................................ 361/699
See application file for complete search history.

(56) References Cited

U.S. PATENT DOCUMENTS

| | | | | |
|---|---|---|---|---|
| 6,349,035 B1 * | 2/2002 | Koenen | ................. | H01L 23/473 |
| | | | | 29/890.03 |
| 6,882,536 B2 * | 4/2005 | Deeney | .................... | H01L 23/36 |
| | | | | 257/E23.101 |
| 6,937,474 B2 * | 8/2005 | Lee | ........................ | H01L 23/427 |
| | | | | 361/679.52 |
| 6,953,227 B2 * | 10/2005 | Dunn | .................. | H01L 23/4332 |
| | | | | 257/E23.091 |
| 8,004,841 B2 * | 8/2011 | Cipolla | ............... | F28D 15/0233 |
| | | | | 174/15.1 |
| 11,246,236 B2 * | 2/2022 | Urai | .................... | H05K 7/20272 |
| 11,516,943 B2 * | 11/2022 | Bilan | ...................... | F28F 27/00 |
| 11,612,084 B1 * | 3/2023 | Swatko | .............. | H05K 7/20881 |
| 11,711,910 B2 * | 7/2023 | Gao | .................. | H05K 7/20272 |
| | | | | 361/699 |
| 11,744,051 B2 * | 8/2023 | Langenfeld | ........ | H05K 7/20872 |
| | | | | 361/696 |
| 2004/0109290 A1 * | 6/2004 | Dunn | .................. | H01L 23/4332 |
| | | | | 257/E23.091 |
| 2005/0128705 A1 * | 6/2005 | Chu | ...................... | H01L 23/473 |
| | | | | 361/689 |

(Continued)

*Primary Examiner* — Anatoly Vortman
(74) *Attorney, Agent, or Firm* — Lee & Hayes, P.C.

(57) ABSTRACT

Systems and techniques for a cooling system are discussed herein. The cooling system may have a cooling block having a first side and a second side opposite the first side. A first computing component may be positioned proximate the first side of the cooling block and a second computing component may be positioned proximate the second side of the cooling block. The cooling block may include a fluid pathway that passes a cooling fluid through where when passing through the fluid pathway the cooling fluid can thermally transfer heat simultaneously from both the first computing component and the second computing component. The cooling system and the computing components can be installed inside a vehicle as its vehicle controller.

20 Claims, 8 Drawing Sheets

(56)         References Cited

U.S. PATENT DOCUMENTS

| | | | | |
|---|---|---|---|---|
| 2006/0002086 A1* | 1/2006 | Teneketges | ........... | H01L 23/473 |
| | | | | 257/E23.098 |
| 2006/0144566 A1* | 7/2006 | Jensen | .................. | H01L 23/473 |
| | | | | 257/E23.098 |
| 2007/0295480 A1* | 12/2007 | Campbell | ............. | H01L 23/427 |
| | | | | 165/80.4 |
| 2008/0026509 A1* | 1/2008 | Campbell | ................. | G06F 1/20 |
| | | | | 165/80.4 |
| 2013/0020126 A1* | 1/2013 | McMenomey, III | ..... | G06F 1/26 |
| | | | | 174/72 R |
| 2015/0109735 A1* | 4/2015 | Campbell | ............ | H05K 7/2079 |
| | | | | 361/700 |
| 2021/0157376 A1* | 5/2021 | McEathron | ........ | B60H 1/00271 |
| 2021/0161033 A1* | 5/2021 | McEathron | ............ | G06F 1/183 |
| 2021/0259141 A1* | 8/2021 | Kim | ................... | B01D 19/0057 |
| 2021/0410319 A1* | 12/2021 | Manousakis | ....... | H05K 7/20809 |
| 2022/0104395 A1* | 3/2022 | Zakaib | ..................... | F28F 1/40 |
| 2023/0152047 A1* | 5/2023 | Zhou | .................. | H05K 7/20254 |
| | | | | 165/104.19 |
| 2023/0200028 A1* | 6/2023 | Xiang | ............... | H05K 7/20863 |
| | | | | 361/702 |

* cited by examiner

HIGH DENSITY COMPUTER COOLING SYSTEM

BACKGROUND

A computing component and/or device, particularly a processor such as a central processing unit (CPU) or a graphics processing unit (GPU), generates heat during operation. Some applications include active cooling systems, e.g., in which a cooling system is thermally coupled to the computing component to prevent overheating. Some conventional designs include, inside a computer system's chassis with multiple GPUs installed, individual cooling systems (e.g., air cooled or liquid cooled) for each of the GPUs, e.g., to control temperature.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
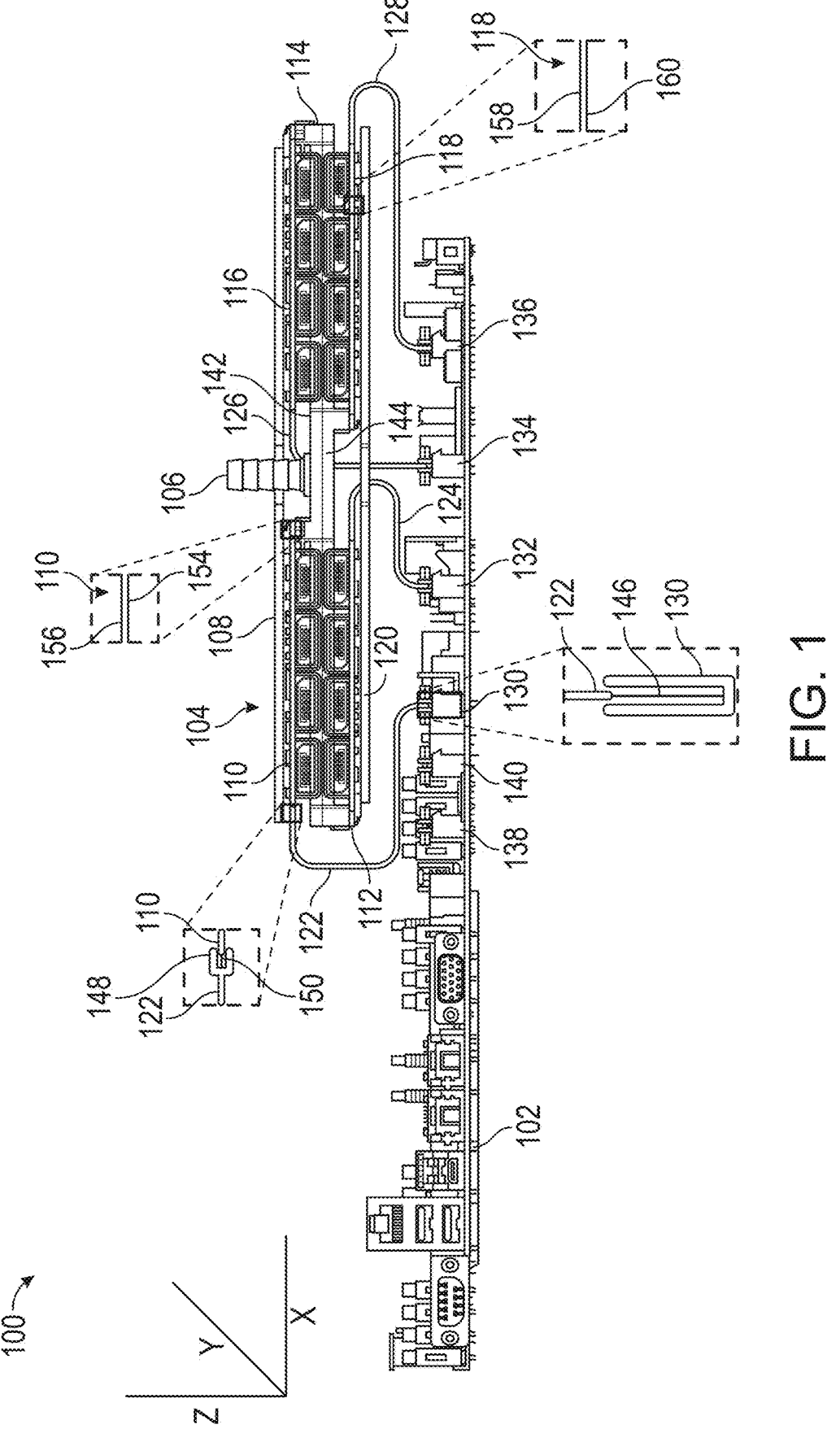
FIG. 1 is an illustration of a computing system using a cooling system for cooling a plurality of computing components.

This application relates to systems and techniques for a cooling system, including a cooling system that can cool multiple computing components. In some examples, the techniques described herein may be used to transfer heat away from one or more computing components. In some examples, the cooling system may be a remote radiator configured to radiate heat generated from the one or more computing components away from the one or more computing components. In some examples, the cooling system may include a first cooling plate, a cooling block, and a second cooling plate. In some examples, the cooling system may be in a sandwich configuration where one or more first computing components is/are positioned between the first cooling plate and a first side of the cooling block and one or more second computing components is/are positioned between a second side of the cooling block that is opposite the first side of the cooling block and the second cooling plate. In some examples, the cooling system may cool the first computing component(s) and the second computing component(s) by transferring heat away from the first computing component(s) and the second computing component(s) simultaneously. In some examples, the heat transfer may be facilitated by passing fluid through at least one of the cooling block, the first cooling plate, and/or the second cooling plate.

In some examples, the first computing component(s) and the second computing component(s) may be electrically connected to a circuit board associated with a computing system. In some examples, the circuit board may be a motherboard of the computing system. In some examples, the first computing component(s) and the second computing component(s) may be processors such as a CPU or a GPU. In some examples, the first computing component(s) and the second computing component(s) may be a Peripheral Computer Interconnect Express (PCIe) component such as a GPU, an image acquisition card (also referred to as a camera ingest card or a frame grabber), a networking component, an audio component, a storage component, and/or the like. In some examples, the circuit board may include a plurality of PCIe slots to which the first computing component(s) and the second computing component(s) may be electrically attached. In some examples, the first computing component(s) and the second computing component(s) may be directly attached to the PCIe slots. In some examples, the first computing component(s) and the second computing component(s) may be electrically attached through a cable that attaches to one of the PCIe slots and one of the computing component(s) or the second computing component(s).

In some examples, the first computing component(s) and the second computing component(s) have a first side and a second side opposite the first side. In some examples, the first computing component(s) and the second computing component(s) may be electrically connected to the circuit board in a vertical orientation or a horizontal orientation, wherein a height of the first computing component(s) and the second computing component(s) in the vertical orientation is greater than the height of the first computing component(s) and the second computing component(s) in the horizontal orientation. In such an example, the vertical orientation may be positioning the first computing component(s) and/or the second computing component(s) at a 90 degree angle, e.g., relative to the circuit board. In such an example, the horizontal orientation may be positioning the first computing component(s) and/or the second computing component(s) at a 0 or 180 degree angle, e.g., relative to the circuit board, such that the first side is on top and the second side is on the bottom or vice versa. In this arrangement, the sides of the computing components may be substantially parallel to a surface of the circuit board.

In some examples, when directly attached to the motherboard, e.g., as the circuit board, the first computing component(s) and the second computing component(s) are in the vertical orientation. In some examples, when electrically attached using a cable, the first computing component(s) and/or the second computing component(s) may be positioned to have a same orientation as the circuit board such that the first computing component(s) and the second computing component(s) (e.g., in a horizontal orientation). For example, the circuit board may define a first plane extending in X and Y dimensions, the first computing component(s) may define a second plane that is different from the first plane, the second plane also extending in the X and Y dimensions, and the second computing component(s) may define a third plane that is different from the first plane and the second plane, the third plane also extending in the X and Y dimensions. The first plane, the second plane, and the third plane may be parallel to each other. In such an example where the first computing component(s), the second computing component(s), and the circuit board define the first plane, the second plane, and the third plane, the first computing component(s) may be vertically stacked above or on top of the circuit board (e.g., stacked in a Z dimension) and the second computing component(s) may be vertically stacked above or on top of the first computing component(s) such that the combination of the stack is at a lower height than the vertical orientation of the first computing component(s) or the second computing component(s) (e.g., maintaining a low profile for the computing system). In some examples, the cable(s) may be turned at 90 degrees to facilitate the horizontal orientation of the first computing component(s) and the second computing component(s).

In some examples, the sandwich orientation of the cooling system may be configured to maintain the low profile of the computing system and add minimal vertical height. In some examples, the cooling block may define an internal fluid pathway between the first side of the cooling block and the second side of the cooling block. In some examples, the cooling system can further include an inlet that permits cooling fluid to enter the fluid pathway and an outlet that permits the cooling fluid to exit the fluid pathway. In some examples, the cooling system may be fluidically connected to a cooling fluid source (also referred to as a cooling fluid reservoir) that acts as a source of the cooling fluid. In some examples, the cooling fluid flows from the cooling fluid source to the inlet and from the outlet back to the fluid source. In some examples, as the cooling fluid passes through the fluid pathway, the cooling fluid can simultaneously transfer heat away from the first computing component(s) and the second computing component(s).

In some examples, the computer system can further include one or more third computing component(s) positioned parallel to the first computing component(s) and a fourth computing component(s) positioned parallel to the third computing component(s). In some examples, the first and the third computing component(s) may be positioned between the first cooling plate and the first side of the cooling block and the second and fourth computing component(s) may be positioned between the second side of the cooling block and the second cooling plate. In some examples, as the cooling fluid passes through the fluid pathway, the cooling fluid can simultaneously transfer heat away from the first computing component(s), the second computing component(s), the third computing component(s), and the fourth computing component(s).

In some examples, the first side of the first computing component(s) may be positioned to face the cooling block and the cooling block may be configured to transfer heat generated at the first side of the first computation component(s). In some examples, the first cooling plate may be configured to transfer heat generated at the second side of the first computation component(s) that is opposite the first side of the first computation component(s). In some examples, the first cooling plate may be thermally connected to the cooling block such that the heat is transferred from the first cooling plate to the cooling block. In some examples, the first cooling plate may include a second fluid pathway that permits the cooling fluid to pass through. In some examples, the second fluid pathway may be located within the first cooling plate and may be structurally similar to the first fluid pathway. In some examples, the second fluid pathway may permit the cooling fluid to pass through such that the cooling fluid transfer heat generated at the second side of the first computation component(s) away from the first computation component(s).

In some examples, the first side of the second computation component(s) may be positioned to face the cooling block and the cooling block may be configured to transfer heat generated at the first side of the second computation component(s). In some examples, the second cooling plate may be configured to transfer heat generated at the second side of the second computation component(s) that is opposite the first side of the second computation component(s). In some examples, the second cooling plate may be thermally connected to the cooling block such that the heat is transferred from the second cooling plate to the cooling block. In some examples, the second cooling plate may include a third fluid pathway that permits the cooling fluid to pass through. In some examples, the third fluid pathway may be located within the second cooling plate and may be structurally similar to the first fluid pathway. In some examples, the third fluid pathway may permit the cooling fluid to pass through such that the cooling fluid transfer heat generated at the second side of the second computation component(s) away from the second computation component(s).

In some examples, the inlet is a first inlet and the outlet is a first outlet, where the first inlet and the first outlet are positioned proximate the first side of the cooling block. In some examples, the cooling system can further include a second inlet and a second outlet, wherein the second inlet and the second outlet are positioned proximate the second side of the cooling block. In such an example, the fluid pathway is a first fluid pathway and may be positioned proximate the first side of the cooling block and the cooling block further includes a fourth fluid pathway positioned proximate the second side of the cooling block, wherein the cooling fluid transfers heat from the first computing component(s) when passing through the first fluid pathway through the first inlet and first outlet and transfers heat from the second computing component(s) when passing through the second fluid pathway through the second inlet and the second outlet.

In some examples, additional computing components may be positioned proximate the cooling system. In some examples, the additional computing components may be positioned proximate the first cooling plate such that the additional computing components vertically stacked.

In some examples, because the cooling system maintains a low profile, e.g., a low vertical profile or low vertical height, the computing system may be used as part of a vehicle controller of a vehicle such as an autonomous vehicle. In some examples, the computing system as the vehicle controller may be used to control some or all of the functions of the vehicle. In some examples, the cooling system may be the cooling system of the autonomous vehicle and may be thermally coupled to other vehicle components such as, but not limited to a battery, motor(s), drivetrain(s), powertrain(s), braking system(s), suspension system(s), and/or the like to cool the other vehicle components.

The cooling system techniques described herein may improve functioning of the computing components by providing a robust centralized cooling system that can transfer heat away from all of the computing components simultaneously. In the context of the cooling, the cooling system can be used as a single cooling system to remove heat from the computing components to maintain similar performance across all of the computing components. In the context of the structure of the cooling system and the computing system, the low profile provides an advantage of enabling the computing system to be used in scenarios where space is limited, such as within vehicles. In the context of using a single cooling block to cool all of the computing components, the single cooling block can provide advantages such as reducing points of failure (e.g., fluid conduit to component interfaces), reducing manufacturing costs, reducing labor costs, increase reliability, increase cooling density, and/or the like. These and other improvements to the functioning of the vehicle are discussed herein.

The methods, apparatuses, and systems described herein may be implemented in a number of ways. Example implementations are provided below with reference to the following figures. While this disclosure uses an autonomous vehicle in examples, techniques described herein are not limited to application in autonomous vehicles. For example, a data warehouse that houses servers may benefit from the techniques described by being able to stack more servers into the space. In another example, this disclosure may be used in a personal computing setting where some or all of the components of a personal computer (e.g., a desktop or a laptop) may be fluidically cooled by a central cooling system. In another example, techniques described herein may be used on aircrafts, boats, or other scenarios where space is at a premium. Moreover, non-autonomous vehicles could also benefit from techniques described herein.

FIG. 1 is an illustration of an example computing system 100. The example computing system 100 includes a cooling system for cooling computing components proximate a circuit board. The circuit board, as illustrated, is a circuit board 102. In some examples, the circuit board 102 may correspond to a motherboard associated with a computer, a server, or the like. The cooling system, as illustrated, is a cooling system 104 which includes cooling components and electrical components. In some examples, as illustrated, the cooling system 104 may be positioned proximate a horizontal longitudinal axis of the circuit board 102 such that the computing system 100 remains compact and low profile along its vertical axis perpendicular to the horizontal axis. The cooling components, as illustrated, include a nozzle 106, a first cooling plate 108, a second cooling plate 120, and a cooling block 114. Each of the first cooling plate 108, the second cooling plate 120, and the cooling block 114 has a first side 142 and a second side 144 opposite the first side 142. The computing components, as illustrated, include a first computing component 110, a second computing component 112, a third computing component 116, and a fourth computing component 118. The computing components 110, 112, 116, and 118 have a first side (also referred to as a frontside) and a second side opposite the first side (also referred to as a backside). In some examples, the first side of the computing components 110, 112, 116, and 118 may include one or more processing components, one or more memory components, and/or other electrical components that may generate heat when in the computing components 110, 112, 116, and 118 are in operation. In some examples, the second side of the computing components 110, 112, 116, and 118 may include one or more memory components and/or other electrical components that may generate heat when in the computing components 110, 112, 116, and 118 are in operation. For example, the first side the computing components 110 and 116 may be a first side 154 and the second side of the computing components 112 and 118 may be a second side 156. As another example, the first side of the computing components 112 and 118 may be a first side 158 and the second side of the computing components 112 and 118 may be a second side 160.

In some examples, the circuit board 102 may be a motherboard associated with a computer, a server, or the like. In some examples, the circuit board may include one or more receptacles, connectors, slots, or the like. For example, the circuit board can include an individual connector configured to connect to a computing component. The circuit board 102, as illustrated, includes six such connectors (e.g. first circuit board connector 130, second circuit board connector 132, third circuit board connector 134, fourth circuit board connector 136, fifth circuit board connector 138, and sixth circuit board connector 140) where circuit board connectors 130-136 are electrically connected to computing components 110, 112, 116, and 118 respectively. The circuit board connectors 130, 132, 134, and 136, as illustrated, are receptacle configured to receive a mating plug. As an illustrative example, the first circuit board connector 130 is a receptacle configured to receive a cable mating plug 146 of first cable 122.

In some examples, each circuit board connector may be a PCIe slot. In some examples, each slot may be compatible with up to at least 16 lanes PCIe 7.x (PCIe 7.x x16). In some examples, each of the computing components 110, 112, 116, and 118 may be PCIe components. The computing components 110, 112, 116, and 118, as illustrated, may be GPUs (also referred to as graphics processors). Alternative examples of the computing components 110, 112, 116, and 118 may be, but are not limited to, an image acquisition card (also referred to as a camera ingest card or a frame grabber), networking components (e.g., wired networking, wireless networking, and/or the like) audio components (e.g., sound cards), storage components, port expansion components (e.g., additional USB 2, 3, 4, and/or 5 ports, Thunderbolt 3, 4, and/or 5 ports, and/or the like) and/or the like.

In some conventional arrangements, computing devices configured to be coupled to the circuit board 102 may be "blade-style" devices. For example, such conventional devices may have a connector for cooperating with the slots proximate a first edge of the device, with the component extending rigidly from the connector (and thus from the slot) along a length in a direction perpendicular to the circuit board 102 (e.g., vertically in the orientation of FIG. 1.) As will be appreciated, by having the computing component extend from the circuit board 102 in this manner, the overall height of the computing system corresponds to the length of the computing component. Moreover, with increased length, any loading or the like on the device, for example at a distal edge of the device opposite the connector, will put forces on the connection of the device to the circuit board 102. This loading may be particularly prevalent in application, such as in autonomous vehicles, where the system is regularly subjected to outside forces.

Instead, in examples of this disclosure and as shown in FIG. 1, the computing components 110, 112, 116, and 118, as illustrated, are arranged generally parallel to the circuit board 102. For example, the circuit board 102 define a first plane extended in the X and Y dimensions, the first computing component 110 defines a second plane parallel to the first plane and also extending in the X and Y dimensions, and the second computing component 112 defines a third plane parallel to the first plane and the second plane and also extending in the X and Y dimension. The first plane, the second plane, and the third plane are different from each other. Furthermore, when parallel to the circuit board 102, the second computing component 112 may be stacked on top of the circuit board 102 and the first computing component 110 may be stacked on top of the second computing component 112 such that the position of the second computing component 112 in the Z dimension is greater than the position of the circuit board 102 in the Z dimension and less than the position of the first computing component 110 in the Z dimension (e.g., the second computing component 112 is stacked on top of the circuit board 102 and the first computing component 110 is stacked on top of the second computing component 112

To facilitate this arrangement, in the example of FIG. 1, the computing components are connected to their respective connector on the circuit board 102 using a wire, cable, ribbon, or other physical connection. In the example of FIG. 1, the first computing component 110 is electrically connected to first circuit board connector 130 using the first cable 122, the second computing component 112 is electrically connected to second circuit board connector 132 using second cable 124, the third computing component 116 is electrically connected to third circuit board connector 134 using third cable 126, and the fourth computing component 118 is electrically connected to the fourth circuit board connector 136 using fourth cable 128. In some examples, the cables 122, 124, 126, and 128 may be flexible cables or rigid cables. The arrangement of the cables 122, 124, 126, and 128 in FIG. 1 are illustrated examples. The cables 122, 124, 126, and 128 may be arranged in any order and may be connected to any of the circuit board connectors 130, 132, 134, or 136.

As illustrated, each of the cables 122, 124, 126, and 128 has a cable mating plug that may be coupled to the connectors 130, 132, 134, and 136 as illustrated by the cable mating plug 146 association with the first cable 122 being coupled with the first circuit board connector 130 perpendicular to a first plane associated with the circuit board. Each of the cables 122, 124, 126, and 128 also has a cable receptacle configured to receive a computing component mating plug. As an illustrative example, the first cable 122 has a cable mating receptacle 148 that receives a computing component mating plug 150 associated with the first computing component 110 at the second plane associated with the first computing component 110. While FIG. 1 illustrates cables 122, 124, 126 and 128 being coupled perpendicularly to the first plane, in some examples, the cables 122, 124, 126, and 128 may be coupled nonparallel to the first plane.

Alternatively, in some examples, the circuit board 102 may be a first circuit board and instead of cables, one or more computing components 110, 112, 116, or 118 may be coupled to one or more second circuit boards that is perpendicularly coupled to the circuit board 102 such that the circuit board 102 defines a first plane and one or more computing components 110, 112, 116, or 118 defines a second plane parallel to the first plane. In some examples, the second circuit boards may be coupled to the circuit board 102 via the circuit board connectors 132, 134, 136, or 138. In some examples, the second circuit boards may include a second mating receptable corresponding to cable mating receptacle 148 that is configured to couple to one of the computing components 110, 112, 116, or 118. In some examples, using the cables and/or the second circuit boards to electrically connect the circuit board 102 to the cooling system 104 and the computing components 110, 112, 116, and 118 reduces the total vertical height of the computing system 100 and allows the computing system 100 system to be used a computer and/or controller in scenarios such as a vehicle or a horizontal rack server where vertical height is limited.

Additionally, or alternatively, in some examples, computing components may be directly connected to the slots by being directly attached into the slots. For example, one or the more of the computing components may have a rigid connector (e.g., the computing component mating plug 150) that facilitates attachment of the component(s) in the illustrated, horizontal arrangement. In some examples, the computing system 100 may include additional computing components along the horizontal axis of the cooling system 104 and the circuit board 102 and a dimension of the cooling system 104 may be expanded to cool the additional computing components.

In some examples, the cooling system 104 is configured to transfer heat away from the computing components 110, 112, 116, and 118. The first side 142 of the cooling block 114, as illustrated, is positioned proximate the first side 154 of the computing components 110 and 116 and the second side 144 of the cooling block 114 is positioned proximate the first side of the computing components 112 and 118. In some examples, the inside of the cooling block 114 may include a space defining a fluid pathway and a fluid is cycled or passed through the fluid pathway. As the fluid passes through the fluid pathway, heat generated by the computing components 110, 112, 116, and 118 during their respective operations are thermally transferred to the fluid and thereby cooling the computing components 110, 112, 116, and 118 and maintaining the computing components 110, 112, 116, and 118 at a safe operating temperature.

Figure 6:
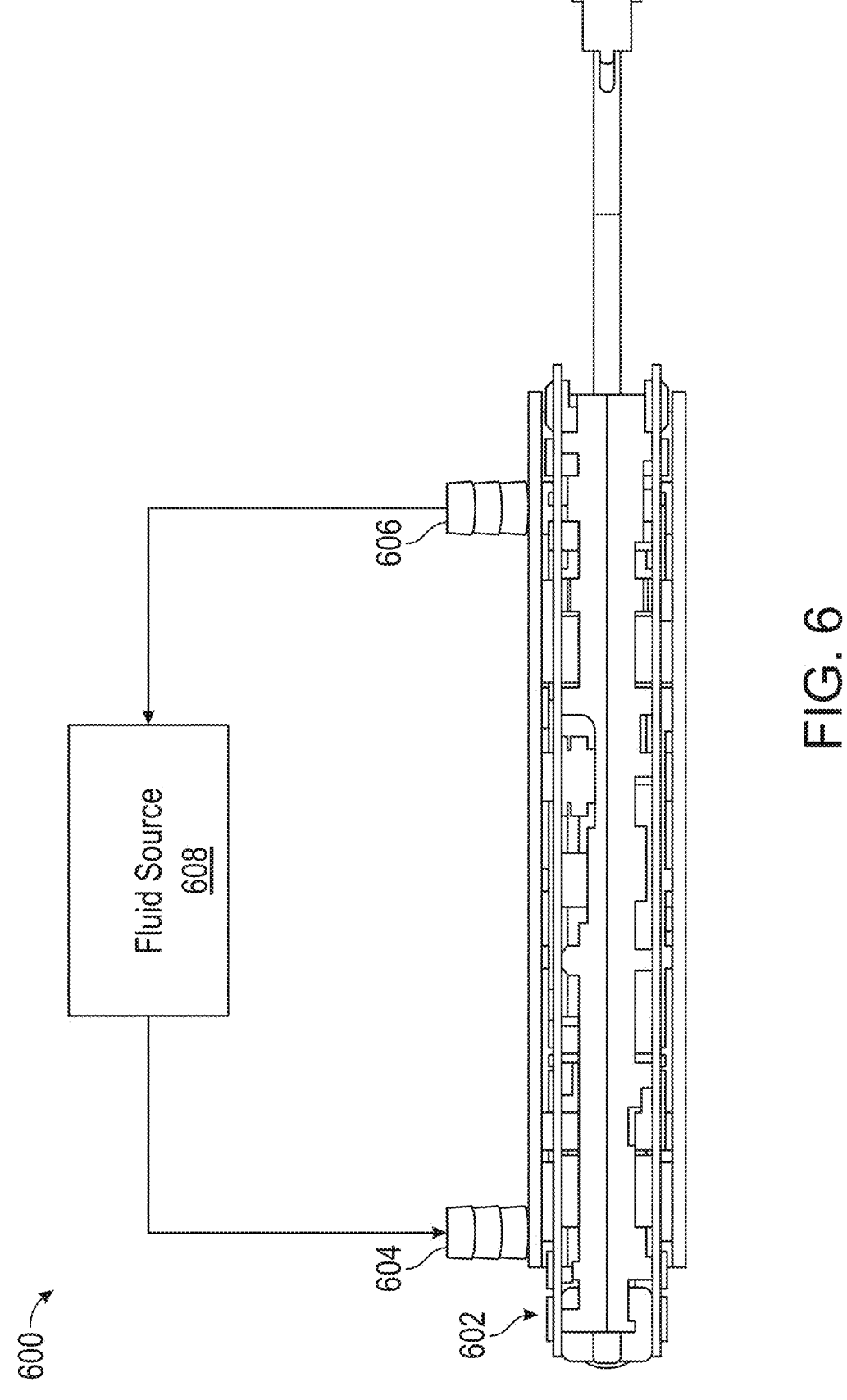
FIG. 6 is an illustration of the cooling system for cooling the plurality of computing components and a fluid source.

The cooling system 104, as illustrated, includes a nozzle 106. The nozzle 106 defines an opening through which the fluid is permitted to pass into and/or out of the cooling block 114. In some examples, the cooling system 104 may have at least two of the nozzle 106, one configured as an inlet for the fluid to enter the cooling block 114 and the other configured as an outlet for the fluid to exit the cooling block 114. In some examples, the fluid may be a liquid, a gas, or the like. In some examples, for example as illustrated in FIG. 6, the fluid may travel in a closed loop fashion from a fluid source to the cooling block 114 and back to the fluid source. In some examples, this closed loop may further include a pump either integrated with the fluid source or independent of the fluid source, where the pump cycles the fluid through the closed loop. In some examples, the fluid traveling from the fluid source to the cooling block 114 may be a cooled fluid and the fluid traveling from the cooling block 114 to the fluid source may be a heated fluid with a higher temperature than a temperature associated with the cooled fluid. In some examples, fluid may be cooled to the temperature associated with the cooled fluid while inside the fluid source.

In some examples, the cooling block 114 may include two spaces defining a first fluid pathway and a second fluid pathway. In some examples, the first fluid pathway is positioned at a portion of the cooling block that is proximate the computing components 110 and 112, whereby cooling fluid traveling through the first fluid pathway cools the computing components 110 and 112 by receiving heat from the computing components 110 and 112. In some examples, the second fluid pathway is positioned at a second portion of the cooling block that is proximate the computing components 116 and 118, whereby the cooling fluid traveling through the second fluid pathway cools the computing components 116 and 118 by receiving heat from the computing components 116 and 118.

In some examples, the first fluid pathway and the second fluid pathway may be customized to fit the cooling needs of a particular computing component. In some examples, the first fluid pathway and second fluid pathway may be arranged asymmetrically. For example, the computing components 110, 112, 116, and 118 may be arranged or oriented such that the portions of the computing components 110, 112, 116, and 118 that generate the most heat (e.g., the processor components of the computing components 110, 112, 116, and 118 and/or the memory components of the computing components 110, 112, 116, and 118) are positioned proximate the inlet such that the cooled fluid passes proximate the components that generate the most heat before other portions of the computing components 110, 112, 116, and 118.

In some examples, each of the computing components 110, 112, 116, and 118 may have components that are arranged differently from each other. In such an example, the cooling block 114 may be customized such that the cooling block includes cooling areas that are thermally coupled to the computing components 110, 112, 116, and 118 that are shaped to fit the arrangement of each of the computing components 110, 112, 116, and 118 and to maximize the thermal transfer area to transfer heat away from the computing components 110, 112, 116, and 118. In some examples, a first cooling area associated with the first computing component 110 and the first fluid pathway may be shaped different from a cooling area associated with the third computing component 116 and the second fluid pathway. In such an example, the different shapes of the first and second cooling areas may result in the cooling fluid passing the first cooling area to flow differently or asymmetrically from the cooling fluid passing through the second cooling area. In some examples, the cooling block 114 may define a single fluid pathway including a single cooling area thermally coupled to computing components 110, 112, 116, and 118 such that the cooling fluid passing through the single fluid pathway and the single cooling area transfers heat away from the computing components 110, 112, 116, and 118 to the cooling fluid. In examples. Fluid pathways can be arranged serially or in parallel with regards to the areas designated for coupling to computing components 110, 112, 116, and/or 118. For example, fluid may flow in parallel to both areas configured to cool components 110 and 112 and then serially into both of areas for 116 and 118.

In some examples, the cooling fluid may enter the cooling block 114 through the nozzle 106 and enters both the first fluid pathway and the second fluid pathway to transfer heat away from the computing components 110, 112, 116, and 118 simultaneously. In some examples, equal volumes of the fluid and/or the fluid flowing at a same flow rate may enter the first fluid pathway and the second fluid pathway. In some examples, the volume of the fluid and/or the flow rate of the fluid entering each of the first fluid pathway and/or the second fluid pathway may be adjusted based on the temperature of at least one of the computing components 110, 112, 116, or 118. For example, if a higher temperature is detected at the first computing component 110 and/or if the temperature at the first computing component 110 is determined to have exceeded a temperature threshold (e.g. using a temperature sensor positioned proximate the first computing component 110), then the volume of the fluid and/or the flow rate of the fluid associated with the first fluid pathway may be adjusted to be higher than the volume of the fluid and/or the flow rate of the fluid associated with the second fluid pathway.

The cooling system, as illustrated, also includes a first cooling plate 108 positioned proximate the second side of the computing components 110 and 112. In some examples, the first cooling plate 108 may be configured to cool the components positioned at the second side of the computing components 110 and 112. In some examples, the first cooling plate 108 may be cooling the components using passive heat transfer. In such an example, the first cooling plate 108 may be thermally coupled to the cooling block 114 such that heat generated at the second side 156 of the computing components 110 and 116 may be transferred to the fluid passing through the cooling block 114 via the first cooling plate 108 and the cooling block 114. Alternatively or additionally, in some examples, the first cooling plate 108 may further include one or more fluid pathways similar to the first fluid pathway and/or the second fluid pathways of the cooling block 114 to permit the fluid to enter the nozzle 106 and travel through the one or more fluid pathways of the first cooling plate 108.

The cooling system, as illustrated, further includes a second cooling plate 120 positioned proximate the second side of the computing components 112 and 118. In some examples, the second cooling plate 120 may be configured to cool the components positioned at the second side of the computing components 112 and 118. In some examples, the second cooling plate 120 may be cooling the components using passive heat transfer. In such an example, the second cooling plate 120 may be thermally coupled to the cooling block 114 such that heat generated at the second side of the computing components 112 and 118 may be transferred to the cooling fluid passing through the cooling block 114 via the second cooling plate 120 and the cooling block 114. Alternatively or additionally, in some examples, the second cooling plate 120 may further include one or more fluid pathways similar to the first fluid pathway and/or the second fluid pathways of the cooling block 114 to permit the fluid to enter the nozzle 106 and travel through the one or more fluid pathways of the second cooling plate 120.

In some examples, the computing components 208, 210, 216, and 218 may be coupled to cooling block portions 212 and 214 using one or more fastening devices such as, but are not limited to, springs or other tensioning devices. In some examples, the one or more fastening devices may cause at least all components of the computing components 208, 210, 216, and 218 that are to be cooled by the cooling fluid to be thermally coupled to the cooling block portions 212 and 214. In such an example, the one or more fastening devices may cause the components to be physically coupled to the cooling block portions 212 and 214 through tension from tightening the fastening devices to the computing components 208, 210, 216, and 218 and/or the cooling block portions 212 and 214.

In examples, the tensioning devices may be integrated into a back plate (such as 206 or 220) such that the black plate, when coupled to the cooling block, provide sufficient tension on one or both sides of a cooling component. This may facilitate proper thermal coupling (e.g., through the use of a thermal interface material) to integrated circuits to be cooled and the corresponding cooling component (e.g., back plate or cooling block) without damaging either component. In some examples, the cooling block and/or back plate may be rigidly attached to a vehicle system to mitigate risks associated with vibration and a tensioning system may be used to couple the cooling block and/or cooling plate to a circuit card or other cooled device. This may enhance vibration resistance and provide a buffer to prevent damage to cooled component.

Figure 2:
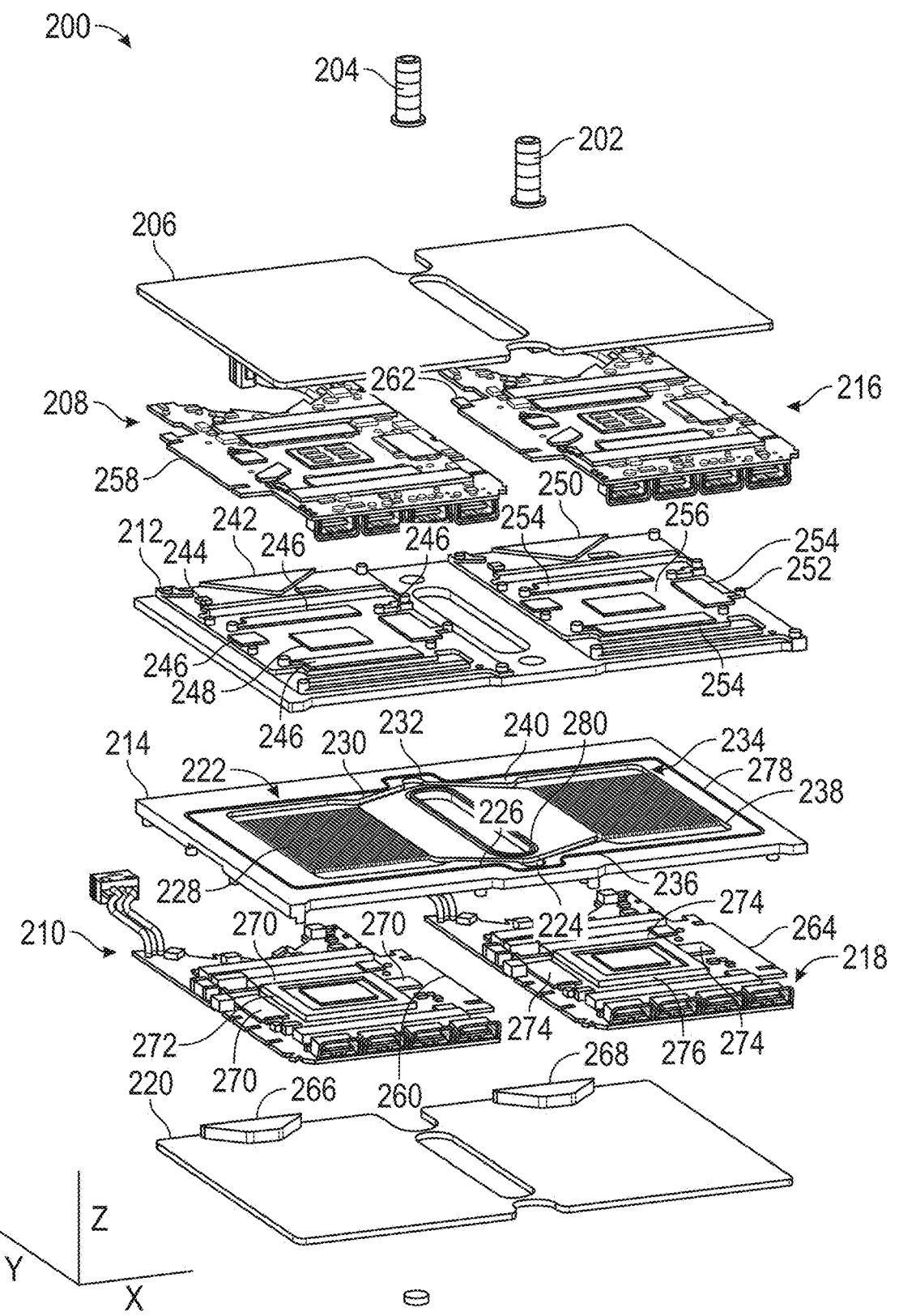
FIG. 2 is an illustration of an exploded view of the cooling system for cooling the plurality of computing components.

FIG. 2 is an illustration of an exploded view of a cooling system 200. In some examples, the cooling system 200 may correspond to the cooling system 104 illustrated and described in association with FIG. 1. The cooling system 200 includes an inlet nozzle 202, an outlet nozzle 204, a first cooling plate 206, a first computing component 208, a second computing component 210, a first cooling block portion 212 of a cooling block, a second cooling block portion 214 of the cooling block, a third computing component 216, a fourth computing component 218, and a second cooling plate 220. In some examples, the first cooling block portion 212 and the second cooling block portion 214 when combined together into a cooling block that may correspond to the cooling block 114 of FIG. 1.

In some examples, the inlet nozzle 202 and the outlet nozzle 204 may correspond to different nozzles of the nozzle 106 of FIG. 1. In some examples, first cooling plate 206 may correspond to the first cooling plate 108 of FIG. 1. In some examples, the second cooling plate 220 may correspond to the second cooling plate 120 of FIG. 1. In some examples, the computing components 208, 210, 216, and 218 may correspond to the computing components 110, 112, 116, and 118 of FIG. 1. In some examples, the computing components 208, 210, 216, and 218 may have a first side and a second side opposite the first side.

In some examples, the first cooling block portion 212 may be thermally coupled to the first (e.g., top) side of computing components 208 and 216. In some examples the first side of the computing components 208 and 216 may correspond to the first side 154 of FIG. 1. In some examples, the first cooling plate 206 may be thermally coupled to the second side of the computing components 208 and 216. In some examples, the second side of the computing components 208 and 216 may correspond to the second side 156 of FIG. 1. In some examples, the first cooling plate 206 may further be thermally coupled to the first cooling block portion 212 such that heat generated at the second side of the computing components 208 and 216 is thermally transferred to fluid passing through the cooling block via at least the first cooling plate 206 and the first cooling block portion 212. As an illustrative example, the first cooling plate 206 may be thermally coupled to the first cooling block portion 212 by coupling to at least heat transfer portions 242 and 250.

In some examples, the second cooling block portion 214 may be thermally coupled to the first side of computing components 210 and 218. In some examples, the first side of computing components 210 and 218 may correspond to the first side 158 of FIG. 1. In some examples, at least a portion of the second cooling plate 220 may be thermally coupled to the second side of the computing components 210 and 218. In some examples, the second side of the computing components 210 and 218 may correspond to the second side 160 of FIG. 1 In some examples, the second cooling plate 220 may further be thermally coupled to the second cooling block portion 214 such that heat generated at the second side of the computing components 216 and 218 is thermally transferred to the fluid passing through the cooling block via at least the second cooling plate 220 and the second cooling block portion 214. As an illustrative example, the cooling plate 220 may thermally couple to the second cooling block portion 214 using the heat transfer portions 266 and 268. In some examples, the first cooling plate 206 may also have similar heat transfer portions as heat transfer portions 266 and 268 and may transfer heat by thermally coupling its heat transfer portions with the heat transfer portions 242 and 250 of the first cooling block portion 212. Similarly, in some examples, the second cooling block portion 214 may include heat transfer portions similar to the heat transfer portions 242 and 250 and may receive heat from the second cooling plate 220 by thermally coupling its heat transfer portions with the heat transfer portions 266 and 268 of the second cooling plate 220.

In some examples, the first cooling block portion 212 and the second cooling block portion 214, when combined, may further be sealed to prevent the fluid, when passing through, from leaking out or between channels within in an unintended manner. FIG. 2 illustrates a first sealing portion 278 and a second sealing portion 280 at the first cooling block portion 212. In some examples, the sealing portions 278 and 280 may be configured to receive a sealing component such as a gasket, an o-ring or the like. In some examples, the first cooling block portion 212 and the second cooling block portion 214 may be sealed together by brazing, conventional welding, friction welding, or the like the sealing portions 278 and 280. In some examples, sealing the cooling block portions 212 and 214 together at the first sealing portion 278 prevents cooling fluid from leaking along the peripherals of the cooling block portions 212 and 214 and sealing the cooling block portions 212 and 214 together at the second sealing portion 280 prevents cooling fluid from leaking along the center of the cooling block portions 212 and 214. In some examples, the second cooling block portion 214 may include sealing portions that correspond to the sealing portions 278 and 280 and configured to receive the sealing component or be seal together with the sealing portions 278 and 280 by brazing, conventional welding, friction welding, or the like.

FIG. 2 also illustrates a first fluid pathway 222 and a second fluid pathway 234. In the example of FIG. 2, the first cooling block portion 212 and the second cooling block portion 214 may be coupled to each other to form the first fluid pathway 222 and the second fluid pathway 234 therebetween. In some examples, the first fluid pathway 222 and the second fluid pathway 234 may correspond to the first fluid pathway and the second fluid pathway described in association with FIG. 1. The first fluid pathway 222 and the second fluid pathway 234 share an inlet 224 and an outlet 232. The inlet 224 is associated with the inlet nozzle 202 and the outlet 232 is associated with the outlet nozzle 204.

As illustrated in FIG. 2, the first fluid pathway 222 is associated with the computing components 208 and 210. In some examples, the first fluid pathway 222 includes a first inlet pathway 226, a first heat transfer portion 228 (also referred to as a first cooling portion), and a first outlet pathway 230. In some examples, the first heat transfer portion 228 may include a geometry configured to maximize the heat transfer area between the computing components 208 and 210 and the cooling block portions 212 and 214. In some examples, the geometry may be fins, pins, columns, scored surfaces, or the like. Alternatively or additionally, the first heat transfer portion 228 may be configured to maximize the volume of fluid flowing through the first fluid pathway. In some examples, the geometry of the first heat transfer portion 228 may be configured to maximize flow of cooling fluid.

As illustrated in FIG. 2, the second fluid pathway 234 is associated with the computing components 216 and 218. In some examples, the second fluid pathway 234 includes a second inlet pathway 236, a second heat transfer portion 238 (also referred to as a second cooling portion), and a second outlet pathway 240. In some examples, the second heat transfer portion 238 include a geometry configured to maximize the heat transfer area between the computing components 216 and 218 and the cooling block portions 212 and 214. In some examples, the geometry may be fins. Alternatively or additionally, the second heat transfer portion 238 may be configured to maximize the volume of fluid flowing through the first fluid pathway. In some examples, the geometry of the second heat transfer portion 238 may be configured to maximize flow of the cooling fluid.

In some examples, the cooling fluid enters the cooling system 200 at the inlet nozzle 202 and into the fluid pathways 222 and 234 via the inlet 224. The cooling fluid splits at the inlet 224 to simultaneously flow through both the first fluid pathway 222 via the first inlet pathway 226 and the second fluid pathway 234 via the via the second inlet pathway 236 in order to thermally transfer heat away from the computing components 208, 210, 216, and 218 simultaneously at the heat transfer portions 228 and 238, and rejoins at the outlet 232 via the first outlet pathway 230 and the second outlet pathway 240 to exit the cooling system 200 via the outlet nozzle 204. In some examples, the simultaneous heat transfer at the first fluid pathway 222 and the second fluid pathway 234 allows for thermal transfer of heat from the computing components 208, 210, 216, and 218 such that the temperature of the computing components 208, 210, 216, and 218 are identically or substantially the same. In some examples, the first fluid pathway 222 and the second fluid pathway 234 may be shaped such that surface area of the first cooling block portion 212 and the second cooling block portion 214 that thermally contacts the computing components 208, 210, 216, and 218 are maximized to allow for the greatest amount of thermal transfer from the computing components 208, 210, 216, and 218 to the fluid passing through the first fluid pathway 222 and the second fluid pathway 234. In some examples, the first fluid pathway 222 and the second fluid pathway 234 may be symmetrically shaped.

As illustrated in FIG. 2, the first cooling block portion 212 includes a plurality of peripheral mounting components. As an illustrative example, peripheral mounting portions 244 and 252 are configured to mount the first cooling block portion 212 to the computing components 208 and 216.

Memory mounting portions 246 are configured to mount the first cooling block portion 212 to memory components of the first computing component 208, and processor mounting portion 248 is configured to mount the first cooling block portion 212 to a processor component of the first computing component 208 such that the surface area for thermal coupling is maximized for the memory components and the processor components of the first computing component 208. The memory components and the processor components of the first computing component 208 may correspond to the memory components 270 and the processor component 272 of the second computing component 210.

Memory mounting portions 254 are configured to mount the first cooling block portion 212 to memory components of the third computing component 216, and processor mounting portion 256 is configured to mount the first cooling block portion 212 to a processor component of the third computing component 216 such that the surface area for thermal coupling is maximized for the memory components and the processor components of the third computing component 216. The memory components and the processor components of the third computing component 216 may correspond to the memory components 274 and the processor component 276 of the fourth computing component 218. The second cooling block portion 214 may be mounted to second computing component 210 and the fourth computing component 218 in the same or similar manner as described in association with the first cooling block portion 212.

The memory mounting portions 246 and 254 and the processor mounting portions 248 and 256 are exemplary mounting portions associated with the computing components 208 and 216. In some examples, the computing components 208 and 216 may include additional components including, but not limited to, voltage regulator modules (VRMs), circuits, capacitors, resistors, direct current (DC) to DC converters, and/or the like, each of which may be mounted respective mounting portions on the first cooling block portion 212.

In some examples, the computing components 210 and 218 may include similar components as the computing components 208 and 216 (e.g., including processor components, memory components, VRMs, circuits, capacitors, rseistors, DC to DC converters, and/or the like). In such an example, the second cooling block portion 214 may also include mounting portions configured to mount the components of computing components 210 and 218 to the second cooling block portion 214.

The first computing component 208, as illustrated in FIG. 2, further includes a mating connector 258 which may be electrically connected to a circuit board such as the circuit board 102 of FIG. 1 using a cable such as the first cable 122 of FIG. 1. The second computing component 210 further includes a mating connector 260 which may be electrically connected to a circuit board such as the circuit board 102 of FIG. 1 using a cable such as the second cable 124 of FIG. 1. The third computing component 216 further includes a mating connector 262 which may be electrically connected to a circuit board such as the circuit board 102 of FIG. 1 using a cable such as the third cable 126 of FIG. 1. The fourth computing component 218 further includes a mating connector 264 which may be electrically connected to a circuit board such as the circuit board 102 of FIG. 1 using a cable such as the fourth cable 128 of FIG. 1.

Figure 3:
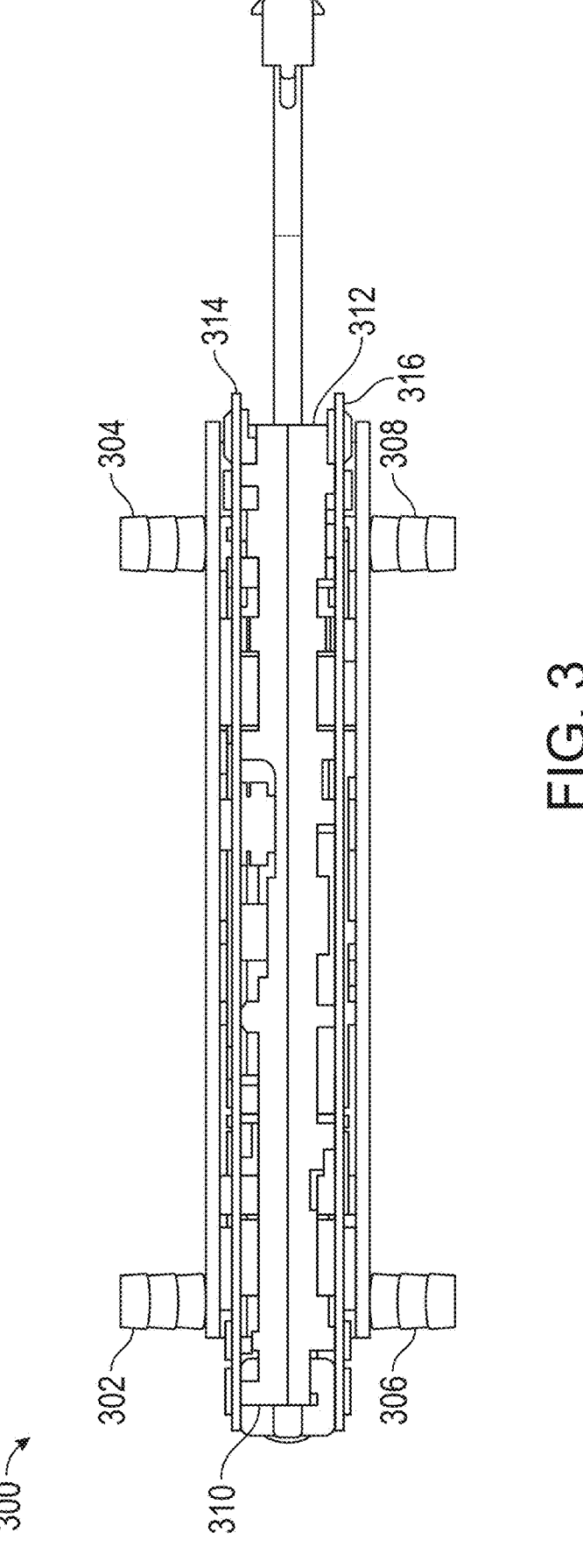
FIG. 3 is an illustration of an alternative cooling system for cooling the plurality of computing components.

FIG. 3 is an illustration of an alternative cooling system 300. While the cooling system 300 largely corresponds to the cooling system 104 of FIG. 1 and the cooling system 200 of the FIG. 2, the cooling system 300 further includes a second inlet 306 and a second outlet 308 in addition to a first inlet 302 and a first outlet 304. In some examples, the first cooling block portion 310 and the second cooling block portion 312 may be similar cooling block portions that are illustrated and described in association with FIG. 2. In some examples, the first inlet 302 may correspond to the inlet nozzle 202 of FIG. 2, and the first outlet 304 may correspond to outlet nozzle 204 of FIG. 2.

In some examples, rather than combining to form one or more fluid pathways (e.g. the first fluid pathway and the second fluid pathway illustrated and described in association with FIGS. 1 and 2), where the fluid pathways are thermally coupled to both computing components 314 and 316, the first cooling block portion 310 includes one or more first fluid pathways that are thermally coupled exclusively to the first computing component 314 and the second cooling block portion 312 includes one or more second fluid pathways that are thermally coupled exclusively to the second computing component 316. A first fluid may enter the first inlet 302 into the first fluid pathways to independently cool the first computing component 314 and exit the first fluid pathways through the first outlet 304. Similarly, a second fluid may enter the second inlet 306 into the second fluid pathways to independently cool the second computing component 316 and exit the second fluid pathways through the second outlet 308. In some examples, the first fluid and the second fluid may enter the first cooling block portion 310 and the second cooling block portion 312 at the same time to transfer heat away from the computing components 314 and 316 simultaneously. In some examples, the first fluid and the second fluid may be stored at a same fluid source or be stored at separate fluid sources with independent fluid pathways between their respective fluid sources and their respective inlets and outlets of the cooling system 300.

Figure 4:
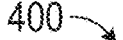
FIG. 4 is an illustration of a top-down view of an alternative cooling system that includes a fluid pathway at the cooling plate.

FIG. 4 illustrates a top-down view of an example cooling system 400. In some examples, the cooling system 400 may correspond to the cooling system 104 of FIG. 1, the cooling system 200 of FIG. 2, and/or the cooling system 300 of FIG.

3. The cooling system 400 includes an inlet nozzle 402, cooling plate 404, and an outlet nozzle 410. The cooling plate 404 may correspond to the first cooling plate 108 of FIG. 1, the first cooling plate 206 of FIG. 2, the second cooling plate 120 of FIG. 1, or the second cooling plate 220 of FIG. 2. The cooling plate 404 includes a first fluid pathway 416, a second fluid pathway 424, a first heat transfer portion 412, and a second heat transfer portion 414. The first heat transfer portion 412 may correspond to the heat transfer portion 266 of FIG. 2. The second heat transfer portion 414 may correspond to the heat transfer portion 268 of FIG. 2. FIG. 4 further includes a first computing component 406 and a second computing component 408. The first computing component 406 may correspond to the first computing component 110 of FIG. 1 or the first computing component 208 of FIG. 2. The second computing component 408 may correspond to the third computing component 116 of FIG. 1 or the third computing component 216 of FIG. 2.

The first fluid pathway 416 includes a first inlet pathway 418, a third heat transfer portion 420, and a first outlet pathway 422. The first fluid pathway 416 is configured to cool the first computing component 406 by transferring heat generated by the first computing component 406 to a cooling fluid passing the first fluid pathway 416. The structure and function of the first fluid pathway 416 may correspond to the structure and function of the first fluid pathway 222 of FIG. 2. In some examples, the first fluid pathway 416 may be included as an alternative to the first fluid pathway 222 or in addition to the first fluid pathway 222.

The second fluid pathway 424 includes a second inlet pathway 426, a fourth heat transfer portion 428, and a second outlet pathway 430. The second fluid pathway 424 is configured to cool the second computing component 408 by transferring heat generated by the second computing component 408 to the cooling fluid passing the second fluid pathway 424. The structure and function of the second fluid pathway 424 may correspond to the structure and function of the second fluid pathway 234 of FIG. 2. In some examples, the second fluid pathway 424 may be included as an alternative to the second fluid pathway 234 or in addition to the second fluid pathway 234. In some examples, the cooling fluid may enter the inlet nozzle 402 and simultaneously pass through the first fluid pathway 416 and the second fluid pathway 424 via the inlet pathways 418 and 426, the heat transfer portions 420 and 428, and exit via the outlet nozzle 410 by passing through the outlet fluid pathways 422 and 430.

Figure 5:
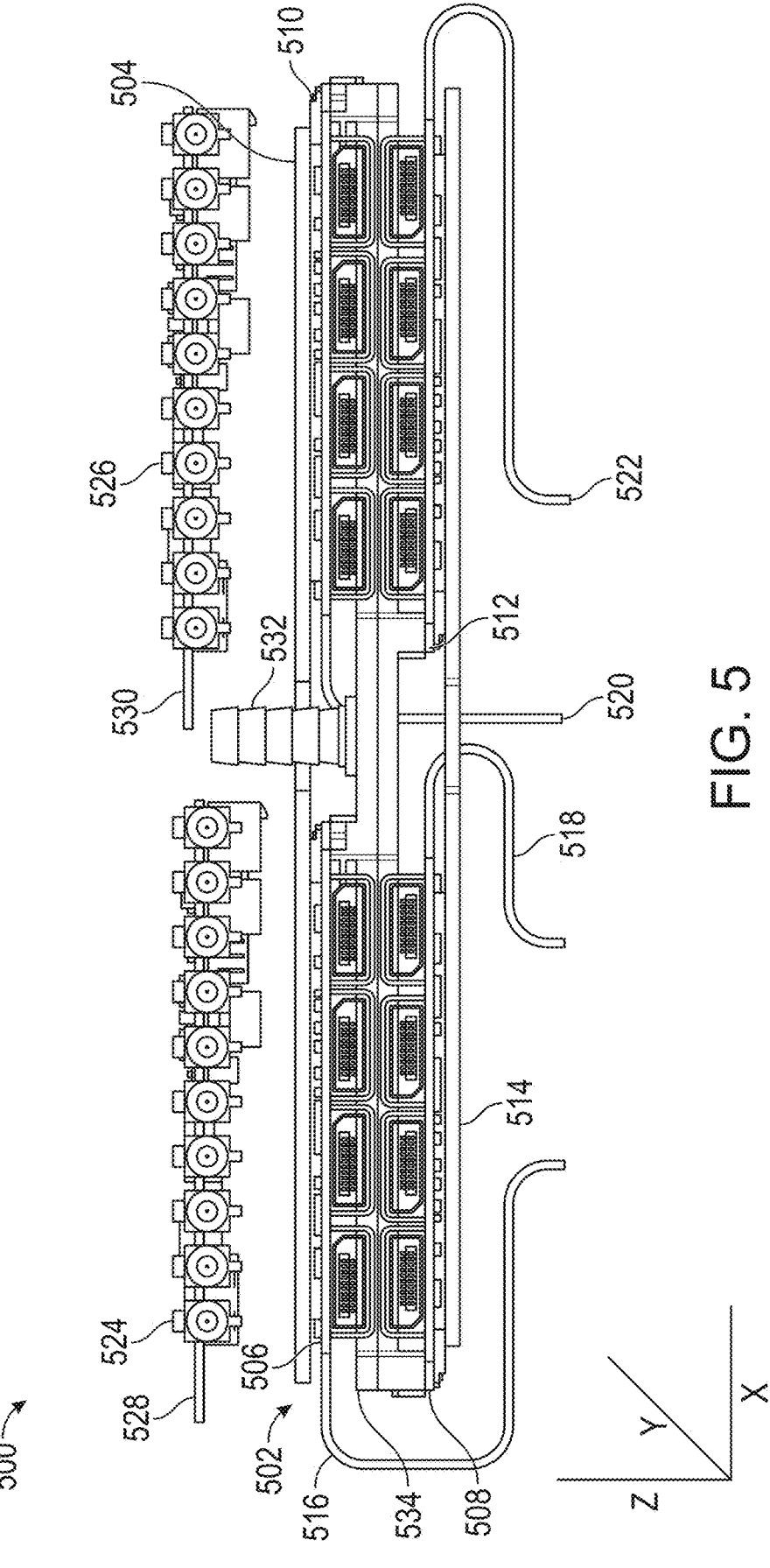
FIG. 5 is an illustration of the cooling system for cooling the plurality of computing components with additional computing components that can be added to the cooling system.

FIG. 5 illustrates an example 500 of a configuration associated with a cooling system 502. In some examples, the cooling system 502 may correspond to the cooling system 104 of FIG. 1 and/or the cooling system 200 of FIG. 2. In some examples, the cooling block 534 may correspond to the cooling block 114 of FIG. 1. In some examples, the first cooling plate 504 may correspond to first cooling plate 108 of FIG. 1. In some examples, the nozzle 532 may correspond to the nozzle 106 of FIG. 1. In some examples, the first computing component 506 may correspond to the first computing component 110 of FIG. 1. In some examples, the second computing component 508 may correspond to the second computing component 112 of FIG. 1. In some examples, the third computing component 510 may correspond to the third computing component 116 of FIG. 1. In some examples, the fourth computing component 512 may correspond to the fourth computing component 118 of FIG. 1. In some examples, the second cooling plate 514 may correspond with the second cooling plate 120 of FIG. 1.

The first cable 516 may correspond to the first cable 122 of FIG. 1 and electrically connects the first computing component 506 with a circuit board such as the circuit board 102 of FIG. 1 by physically coupling with a circuit board connector such as the first circuit board connector 130. The second cable 518 may correspond to the second cable 124 of FIG. 1 and electrically connects the second computing component 508 with a circuit board such as the circuit board 102 of FIG. 1 by physically coupling with a circuit board connector such as the second circuit board connector 132. The third cable 520 may correspond to the third cable 126 of FIG. 1 and electrically connects the third computing component 510 with a circuit board such as the circuit board 102 of FIG. 1 by physically coupling with a circuit board connector such as the third circuit board connector 134. The fourth cable 522 may correspond to the fourth cable 128 of FIG. 1 and electrically connects the fourth computing component 512 with a circuit board such as the circuit board 102 of FIG. 1 by physically coupling with a circuit board connector such as the fourth circuit board connector 136. In some examples, the cables 516, 518, 520, and 522 may be flexible as illustrated or rigid.

Alternatively, in some examples, the circuit board may be a first circuit board and instead of cables, one or more computing components 506, 508, 510, or 512 may be perpendicularly coupled to one or more second circuit boards that is perpendicularly coupled to the circuit board such that the first circuit board defines a first plane and one or more computing components 506, 508, 510, or 512 defines a second plane parallel to the first plane. In some examples, the second circuit boards may be couple to the first circuit board via a first mating receptacle of the first circuit board such as the circuit board connectors 132, 134, 136, or 138. In some examples, the second circuit boards may include a second mating receptable that is configured to couple to one of the computing components 506, 508, 510, or 512. In some examples, using the cables and/or the second circuit boards to electrically connect the first circuit board to the cooling system 502 and the computing components 506, 508, 510, and 512 reduces the total vertical height of the system illustrated in FIG. 5 and allows the system illustrated in FIG. 5 to be used a computer and/or controller in scenarios such as a vehicle or a horizontal rack server where vertical height is limited.

FIG. 5 further illustrates one or more additional computing components such as a fifth computing component 524 and a sixth computing component 526 positioned proximate the cooling system 502. The computing components 524 and 526 as illustrated are image acquisition cards, but may alternatively be GPUs, networking components, audio components, storage components, data port expansion components and/or the like. In some examples, the fifth computing component 524 may use the fifth cable 528 to electrically connected to a circuit board such as the circuit board 102 by physically coupling with a circuit board connector such as the fifth circuit board connector 138. In some examples, the fifth cable 528 may be a same or similar cable as the cables 516, 518, 520, or 522. The sixth computing component 526 may use the sixth cable 530 to electrically connected to a circuit board such as the circuit board 102 by physically coupling with a circuit board connector such as the sixth circuit board connector 140. In some examples, the sixth cable 530 may be a same or similar cable as the cables 516, 518, 520, or 522. In some examples, the fifth and sixth computing components 524 and 526 may be PCIe components. In some examples, the cooling system 502 may define a first plane extending in the X and Y dimensions. In some examples, the fifth and sixth computing components 524 and 526 may define a second plane parallel to the first plane of the cooling system 502 and extending in the X and Y dimensions, the first plane of the cooling system 502 and the second plane of the fifth and sixth computing components 524 and 526 are different.

In some examples, the fifth and sixth computing components 524 and 526 may be coupled to the first cooling plate 504 such that the Z dimension value associated with the fifth and sixth computing components 524 and 526 is higher than the Z dimension value associated with the first cooling plate 504. In some examples, the computing components 524 and 526 may be coupled to an additional cooling system similar to or corresponding to the cooling system 502.

In some examples, cooling block 534 may have a geometry including one or more additional surfaces nonparallel to the first plane and sized and configured to allowed additional components to be physically and/or thermally coupled to or proximate the additional surfaces. In some examples, the fifth component 524 may be thermally or physically coupled to a first additional surface of the cooling block 534 that is nonparallel to the first plane.

FIG. 6 illustrates an example 600 of a closed loop fluid pathway associated with a cooling system 602 and a fluid source 608. In some examples, the cooling system 602 may correspond to the cooling system 104 of FIG. 1 and/or the cooling system 200 of FIG. 2. Example 600 illustrates that fluid may travel in a closed loop fashion from the fluid source 608 to the cooling system 602, enter the cooling system 602 through the inlet 604, exit the cooling system 602 through outlet 606, and return to the fluid source 608 after exiting the cooling system 602. In some examples, this closed loop may further include a pump either integrated with the fluid source or independent of the fluid source, where the pump cycles the fluid through the closed loop. In some examples, the fluid traveling from the fluid source 608 to the cooling system 602 may be a cooled fluid and the fluid traveling from the cooling system 602 to the fluid source 608 may be a heated fluid with a higher temperature than a temperature associated with the cooled fluid. In some examples, the fluid may be cooled to the temperature associated with the cooled fluid while inside the fluid source 608.

Figure 7:
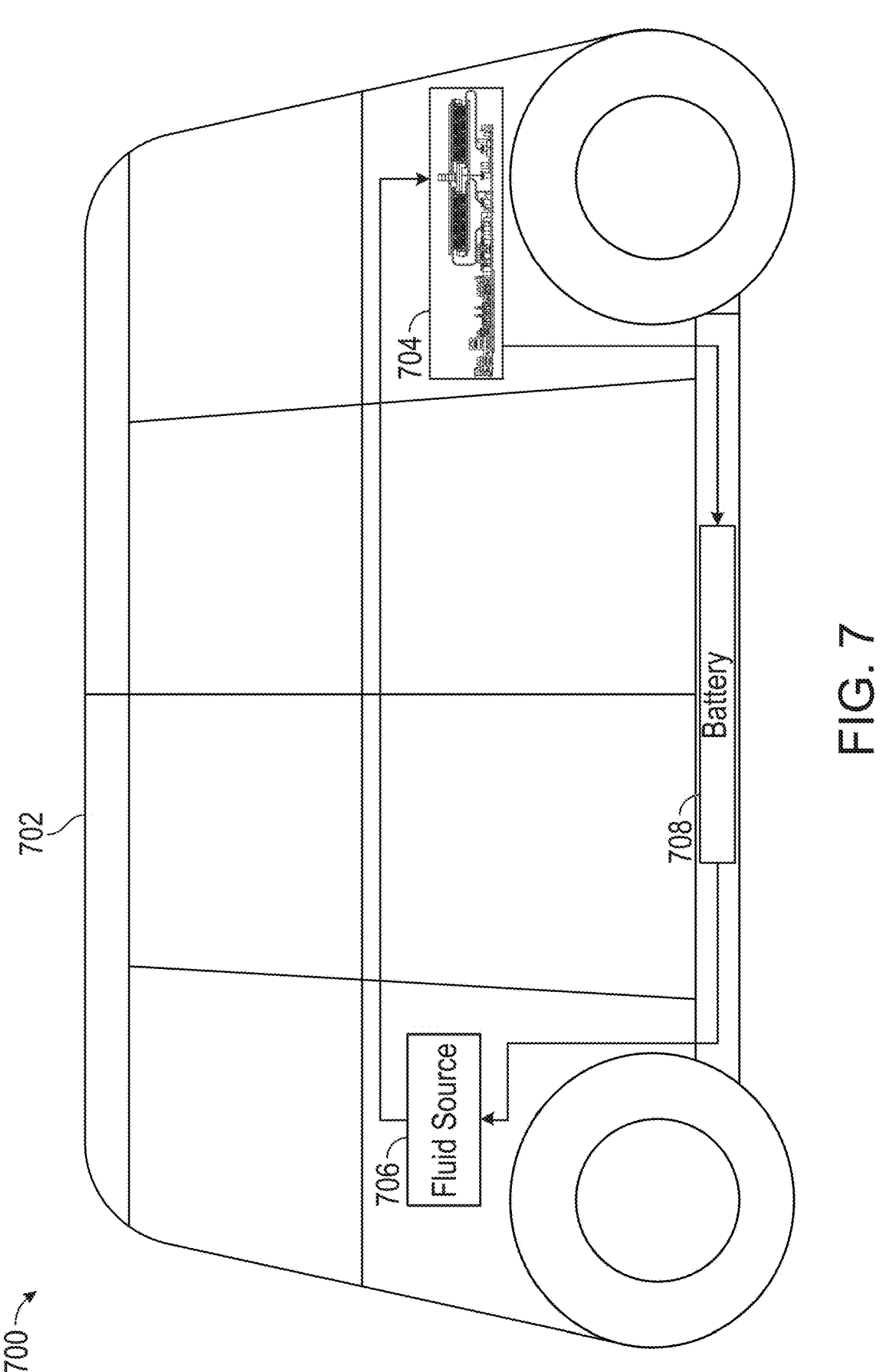
FIG. 7 is an illustration of the computing system and cooling system cooling inside a vehicle.

FIG. 7 is an illustration 700 of a computing system 704 inside a vehicle 702. In the illustration 700, the vehicle 702 is an autonomous vehicle; however, the vehicle 702 may be any other type of vehicle. In some examples, the computing system 704 may correspond to the computing system 100 of FIG. 1. In some examples, the computing system 704 may be a vehicle controller for controlling the vehicle. In some examples, when implemented inside the vehicle 702, the computing system 704 may include the one or more computing device(s) as described in association with FIG. 8 and performs the functions of those one or more computing device(s). In some examples, the computing system 704 may include one or more cooling systems that correspond to the cooling system 104 of FIG. 1 and/or the cooling system 200 of FIG. 2. In some examples, the cooling system(s) of the computing system 704 may be used to cool the one or more processor(s) of the computing system 704 while the vehicle 702 is in operation by permitting fluid flow through the cooling system(s) to thermally transfer heat away from all of the processor(s) simultaneously. Additional functionality of the vehicle 702 and the computing system 704 are describe in association with FIG. 8, as well as throughout this disclosure.

The vehicle 702 further includes a fluid source 706 that is configured to store and/or chill a cooling fluid. In some examples, the fluid source 706 may be fluidically coupled to a radiator configured to chill the cooling fluid by transferring heat away from the cooling fluid toward an outside of the vehicle 702 or toward a heat exchanger associated with an HVAC system of the vehicle 702. In some examples, the cooling fluid may pass the heat exchanger associated with the HVAC system that is separate from the radiator. The fluid source 706 is fluidically coupled to the cooling system(s) of the computer system 704 and a battery 708. In some examples, the battery 708 may be configured to electrically power all components of the vehicle 702 including a pump associated with the fluid source 706 to circulate the cooling fluid away from the fluid source 706 and the computer system 704. As illustrated in FIG. 7, the cooling fluid proceeds from the fluid source 706 to the computer system 704, from the computer system 704 to the battery 708, and from the battery back to the fluid source 706. As the cooling fluid passes the computer system 704, heat generated from the computer system 704 is transferred away from the computer system 704 and into the cooling fluid to create a heated cooling fluid. As the heated cooling fluid passes through or proximate the battery 708, the heated cooling fluid can thermally exchange heat with the battery 708 to maintain the battery 708 at an optimal operating temperature. In some examples, the cooling fluid can pass through or proximate additional vehicle component(s) such as, but not limited to, motor(s), drivetrain(s), powertrain(s), braking system(s), suspension system(s), and/or the like to cool and/or thermally exchange heat with those additional vehicle component(s).

Figure 8:
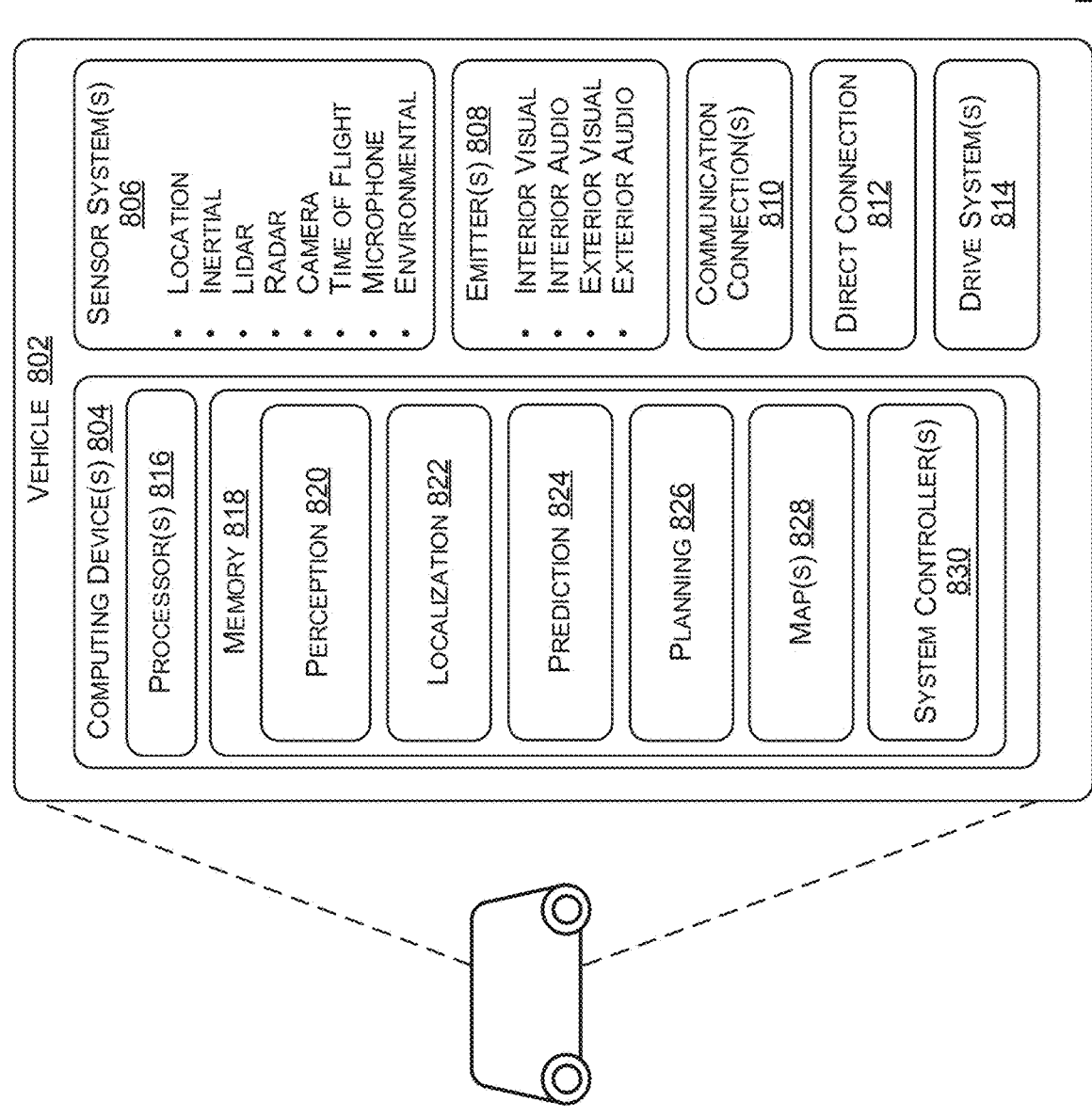
FIG. 8 depicts a block diagram of an example system that uses the cooling system.

FIG. 8 depicts a block diagram of an example system 800 that implements one or more computing device(s) being cooled by one or more cooling system(s) corresponding to the cooling system 104 of FIG. 1 and/or the cooling system 200 of FIG. 2, as well as other cooling system(s) described throughout this disclosure. In at least one example, the system 800 may include a vehicle 802. In the illustrated example system 800, the vehicle 802 is an autonomous vehicle; however, the vehicle 802 may be any other type of vehicle.

In some examples, the vehicle 802 may be a driverless vehicle, such as an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In such examples, because the vehicle 802 may be configured to control all functions from start to completion of the trip, including all parking functions, it may not include a driver and/or controls for driving the vehicle 802, such as a steering wheel, an acceleration pedal, and/or a brake pedal. This is merely an example, and the systems and methods described herein may be incorporated into any ground-borne, airborne, or waterborne vehicle, including those ranging from vehicles that need to be manually controlled by a driver at all times, to those that are partially or fully autonomously controlled.

The vehicle 802 may include one or more computing device(s) 804, one or more sensor system(s) 806, one or more emitter(s) 808, one or more communication connection(s) 810 (also referred to as communication devices and/or modems), at least one direct connection 812 (e.g., for physically coupling with the vehicle 802 to exchange data and/or to provide power), and one or more drive system(s) 814. The one or more sensor system(s) 806 may be configured to capture sensor data associated with an environment.

In some examples, the one or more computer device(s) 804 may correspond to one or more of the computing system 704 of FIG. 7, or any of the other computer systems described throughout this disclosure.

The one or more sensor system(s) 806 may include time-of-flight sensors, location sensors (e.g., GPS, compass, etc.), inertial sensors (e.g., inertial measurement units (IUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. The one or more sensor system(s) 806 may include multiple instances of each of these or other types of sensors. For instance, the time-of-flight sensors may include individual time-of-flight sensors located at the corners, front, back, sides, and/or top of the vehicle 802. As another example, the camera sensors may include multiple cameras disposed at various locations about the exterior and/or interior of the vehicle 802. The one or more sensor system(s) 806 may provide input to the computing device(s) 804.

The vehicle 802 may also include one or more emitter(s) 808 for emitting light and/or sound. The one or more emitter(s) 808 in this example include interior audio and visual emitters to communicate with passengers of the vehicle 802. By way of example and not limitation, interior emitters may include speakers, lights, signs, display screens, touch screens, haptic emitters (e.g., vibration and/or force feedback), mechanical actuators (e.g., seatbelt tensioners, seat positioners, headrest positioners, etc.), or the like. The one or more emitter(s) 808 in this example also include exterior emitters. By way of example and not limitation, the exterior emitters in this example include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which may comprise acoustic beam steering technology.

The vehicle 802 may also include one or more communication connection(s) 810 that enable communication between the vehicle 802 and one or more other local or remote computing device(s) (e.g., a remote teleoperation computing device) or remote services. For instance, the one or more communication connection(s) 810 may facilitate communication with other local computing device(s) on the vehicle 802 and/or the one or more drive system(s) 814. Also, the one or more communication connection(s) 810 may allow the vehicle 802 to communicate with other nearby computing device(s) (e.g., other nearby vehicles, traffic signals, etc.).

The one or more communications connection(s) 810 may include physical and/or logical interfaces for connecting the computing device 804 to another computing device or one or more external networks (e.g., the Internet). For example, the one or more communications connection(s) 810 may enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.), satellite communication, dedicated short-range communications (DSRC), or any suitable wired or wireless communications protocol that enables the respective computing device to interface with the other computing device(s).

In at least one example, the vehicle 802 may include one or more drive system(s) 814. In some examples, the vehicle 802 may have a single drive system 814. In at least one example, if the vehicle 802 has multiple drive systems 814, individual drive systems 814 may be positioned on opposite ends of the vehicle 802 (e.g., the front and the rear, etc.). In at least one example, the drive system(s) 814 may include one or more sensor system(s) 806 to detect conditions of the drive system(s) 814 and/or the surroundings of the vehicle 802. By way of example and not limitation, the sensor system(s) 806 may include one or more wheel encoders (e.g., rotary encoders) to sense rotation of the wheels of the drive systems, inertial sensors (e.g., inertial measurement units, accelerometers, gyroscopes, magnetometers, etc.) to measure orientation and acceleration of the drive system, cameras or other image sensors, ultrasonic sensors to acoustically detect objects in the surroundings of the drive system, lidar sensors, radar sensors, etc. Some sensors, such as the wheel encoders may be unique to the drive system(s) 814. In some cases, the sensor system(s) 806 on the drive system(s) 814 may overlap or supplement corresponding systems of the vehicle 802 (e.g., sensor system(s) 806).

The drive system(s) 814 may include many of the vehicle systems, including a high voltage battery, a motor to propel the vehicle, an inverter to convert direct current from the battery into alternating current for use by other vehicle systems, a steering system including a steering motor and steering rack (which may be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). In some examples, the cooling system may correspond to the cooling system 104 of FIG. 1 or the cooling system 200 of FIG. 2. Additionally, the drive system(s) 814 may include a drive system controller which may receive and preprocess data from the sensor system(s) 806 and to control operation of the various vehicle systems. In some examples, the drive system controller may include one or more processor(s) and memory communicatively coupled with the one or more processor(s). The memory may store one or more components to perform various functionalities of the drive system(s) 814. Furthermore, the drive system(s) 814 also include one or more communication connection(s) that enable communication by the respective drive system with one or more other local or remote computing device(s).

The computing device 804 may include one or more processor(s) 816 and memory 818 communicatively coupled with the one or more processor(s) 816. In the illustrated example, the memory 818 of the computing device 804 stores a perception component 820, a localization component 822, a prediction component 824, a planning component 826, a maps component 828, and one or more system controller(s) 830. Though depicted as residing in the memory 818 for illustrative purposes, it is contemplated that the perception component 820, the localization component 822, the prediction component 824, the planning component 826, the maps component 828, and the one or more system controller(s) 830 may additionally, or alternatively, be accessible to the computing device 804 (e.g., stored in a different component of vehicle 802) and/or be accessible to the vehicle 802 (e.g., stored remotely).

The perception component 820 may include functionality to perform object detection, segmentation, and/or classification. In some examples, the perception component 820 may provide processed sensor data that indicates a presence of an entity that is proximate to the vehicle 802 and/or a classification of the entity as an entity type (e.g., car, pedestrian, cyclist, building, tree, road surface, curb, sidewalk, unknown, etc.). In additional and/or alternative examples, the perception component 820 may provide processed sensor data that indicates one or more characteristics associated with a detected entity and/or the environment in which the entity is positioned. In some examples, characteristics associated with an entity may include, but are not limited to, an x-position (global position), a y-position (global position), a z-position (global position), an orientation, an entity type (e.g., a classification), a velocity of the entity, an extent of the entity (size), etc. Characteristics associated with the environment may include, but are not limited to, a presence of another entity in the environment, a state of another entity in the environment, a time of day, a day of a week, a season, a weather condition, an indication of darkness/light, etc.

Further, the perception component 820 may include functionality to store perception data generated by the perception component 820. In some instances, the perception component 820 may determine a track corresponding to an object that has been classified as an object type. For purposes of illustration only, the perception component 820, using sensor system(s) 806 may capture one or more images of an environment. The sensor system(s) 806 may capture images of an environment that includes an object, such as a pedestrian. The pedestrian may be at a first position at a time T and at a second position at time T+t (e.g., movement during a span of time t after time T). In other words, the pedestrian may move during this time span from the first position to the second position. Such movement may, for example, be logged as stored perception data associated with the object.

The stored perception data may, in some examples, include fused perception data captured by the vehicle. Fused perception data may include a fusion or other combination of sensor data from sensor system(s) 806, such as image sensors, lidar sensors, radar sensors, time-of-flight sensors, sonar sensors, global positioning system sensors, internal sensors, and/or any combination of these. The stored perception data may additionally or alternatively include classification data including semantic classifications of objects (e.g., pedestrians, vehicles, buildings, road surfaces, etc.) represented in the sensor data. The stored perception data may additionally or alternatively include track data (positions, orientations, sensor features, etc.) corresponding to motion of objects classified as dynamic objects through the environment. The track data may include multiple tracks of multiple different objects over time. This track data may be mined to identify images of certain types of objects (e.g., pedestrians, animals, etc.) at times when the object is stationary (e.g., standing still) or moving (e.g., walking, running, etc.). In this example, the computing device determines a track corresponding to a pedestrian.

The localization component 822 may include functionality to receive data from the sensor system(s) 806 and/or other components to determine a position of the vehicle 802. For example, the localization component 822 may include and/or request/receive a three-dimensional map of an environment and may continuously determine a location of the autonomous vehicle within the map. In some instances, the localization component 822 may use SLAM (simultaneous localization and mapping) or CLAMS (calibration, localization and mapping, simultaneously) to receive time-of-flight data, image data, lidar data, radar data, sonar data, IMU data, GPS data, wheel encoder data, or any combination thereof, or the like to accurately determine a location of the autonomous vehicle. In some instances, the localization component 822 may provide data to various components of the vehicle 802 to determine an initial position of an autonomous vehicle for generating a trajectory, as discussed herein.

The prediction component 824 may generate one or more probability maps representing prediction probabilities of possible locations of one or more objects in an environment. For example, the prediction component 824 may generate one or more probability maps for vehicles, pedestrians, animals, or the like within a threshold distance from the vehicle 802. In some instances, the prediction component 824 may measure a track of an object and generate a discretized prediction probability map, a heat map, a probability distribution, a discretized probability distribution, and/or a trajectory for the object based on observed and predicted behavior. In some instances, the one or more probability maps may represent an intent of the one or more objects in the environment.

The planning component 826 may determine a path for the vehicle 802 to follow to traverse through an environment. For example, the planning component 826 may determine various routes and paths and various levels of detail. In some instances, the planning component 826 may determine a route to travel from a first location (e.g., a current location) to a second location (e.g., a target location). For the purpose of this discussion, a route may be a sequence of waypoints for traveling between two locations. As non-limiting examples, waypoints include streets, intersections, global positioning system (GPS) coordinates, etc. Further, the planning component 826 may generate an instruction for guiding the autonomous vehicle along at least a portion of the route from the first location to the second location. In at least one example, the planning component 826 may determine how to guide the autonomous vehicle from a first waypoint in the sequence of waypoints to a second waypoint in the sequence of waypoints. In some examples, the instruction may be a path, or a portion of a path. In some examples, multiple paths may be substantially simultaneously generated (i.e., within technical tolerances) in accordance with a receding horizon technique. A single path of the multiple paths in a receding data horizon having the highest confidence level may be selected to operate the vehicle.

In other examples, the planning component 826 may alternatively, or additionally, use data from the perception component 820 and/or the prediction component 824 to determine a path for the vehicle 802 to follow to traverse through an environment. For example, the planning component 826 may receive data from the perception component 820 and/or the prediction component 824 regarding objects associated with an environment. Using this data, the planning component 826 may determine a route to travel from a first location (e.g., a current location) to a second location (e.g., a target location) to avoid objects in an environment. In at least some examples, such a planning component 826 may determine there is no such collision free path and, in turn, provide a path which brings vehicle 802 to a safe stop avoiding all collisions and/or otherwise mitigating damage.

The memory 818 may further include one or more maps 828 that may be used by the vehicle 802 to navigate within the environment. For the purpose of this discussion, a map may be any number of data structures modeled in two dimensions, three dimensions, or N-dimensions that are capable of providing information about an environment, such as, but not limited to, topologies (such as intersections), streets, mountain ranges, roads, terrain, and the environment in general. A map may further include an object identifier, an object classification, a three-dimensional location, covariance data (e.g., represented in image data or a multi-resolution voxel space), or the like. In some instances, a map may include, but is not limited to: texture information (e.g., color information (e.g., RGB color information, Lab color information, HSV/HSL color information), or the like), intensity information (e.g., LIDAR information, RADAR information, or the like); spatial information (e.g., image data projected onto a mesh, individual "surfels" (e.g., polygons associated with individual color and/or intensity)), reflectivity information (e.g., specularity information, retroreflectivity information, BRDF information, BSSRDF information, or the like). In one example, a map may include a three-dimensional mesh of the environment. In some instances, the map may be stored in a tiled format, such that individual tiles of the map represent a discrete portion of an environment, and may be loaded into working memory as needed, as discussed herein. In at least one example, the one or more maps 828 may include at least one map (e.g., images and/or a mesh). In some examples, the vehicle 802 may be controlled based at least in part on the map(s) 828. That is, the map(s) 828 may be used in connection with the perception component 820 (and sub-components), the localization component 822 (and sub-components), the prediction component 824, and/or the planning component 826 to determine a location of the vehicle 802, identify objects in an environment, generate prediction probabilit(ies) associated with objects and/or the vehicle 802, and/or generate routes and/or trajectories to navigate within an environment.

In at least one example, the computing device 804 may include one or more system controller(s) 830, which may be configured to control steering, propulsion, braking, safety, emitters, communication, and other systems of the vehicle 802. These system controller(s) 830 may communicate with and/or control corresponding systems of the drive system(s) 814 and/or other components of the vehicle 802, which may be configured to operate in accordance with a path provided from the planning component 826.

The processor(s) 816 of the computing device 804 may be any suitable processor capable of executing instructions to process data and perform operations as described herein. By way of example and not limitation, the processor(s) 816 may comprise one or more Central Processing Units (CPUs), Graphics Processing Units (GPUs), or any other device or portion of a device that processes electronic data to transform that electronic data into other electronic data that may be stored in registers and/or memory. In some examples, integrated circuits (e.g., ASICs, etc.), gate arrays (e.g., FPGAs, etc.), and other hardware devices may also be considered processors in so far as they are configured to implement encoded instructions.

The memory 818 may be a non-transitory computer-readable media. The memory 818 may store an operating system and one or more software applications, instructions, programs, and/or data to implement the methods described herein and the functions attributed to the various systems. In various implementations, the memory 818 may be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein may include many other logical, programmatic, and physical components, of which those shown in the accompanying Figures are merely examples that are related to the discussion herein In some instances, aspects of some or all of the components discussed herein may include any models, algorithms, and/or machine-learning algorithms. For example, in some instances, the components in the memory 818 may be implemented as a neural network.

In some examples, the neural network may train a machine learned model that may determine a condition of one or more vehicle components such as a condition of a tire. The neural network may receive a reference data set of images of tires labeled with new tire conditions and training data sets of images of tires labeled based on one or more tire conditions. The training data sets may include images of tires at different types of tire conditions and a different wear levels of each particular tire condition. In some examples, the label may be tread depth. The images may be indicative of different levels of wear of the tire such each with different level of tread depths that are indicative of gradual wear of the tire. In some examples, the label may be distance traveled by the tire. In some examples, the label may be other types of tire wear such as puncture, uneven wear, and/or mis-alignment of tire. In some examples, vehicle 802 may determine the condition of the tire based on the machine learned model. In some examples, the neural network may train machine learned models to determine wear levels of different conditions of other vehicle components (e.g., motor, brakes, suspensions, drivetrain, joints, sensors, and/or the like).

As described herein, an exemplary neural network is an algorithm that passes input data through a series of connected layers to produce an output. Each layer in a neural network may also comprise another neural network, or may comprise any number of layers (whether convolutional or not). As may be understood in the context of this disclosure, a neural network may utilize machine learning, which may refer to a broad class of such algorithms in which an output is generated based on learned parameters.

Although discussed in the context of neural networks, any type of machine learning may be used consistent with this disclosure. For example, machine learning or machine-learned algorithms may include, but are not limited to, regression algorithms (e.g., ordinary least squares regression (OLSR), linear regression, logistic regression, stepwise regression, multivariate adaptive regression splines (MARS), locally estimated scatterplot smoothing (LOESS)), instance-based algorithms (e.g., ridge regression, least absolute shrinkage and selection operator (LASSO), elastic net, least-angle regression (LARS)), decisions tree algorithms (e.g., classification and regression tree (CART), iterative dichotomiser 3 (ID3), Chi-squared automatic interaction detection (CHAID), decision stump, conditional decision trees), Bayesian algorithms (e.g., naïve Bayes, Gaussian naïve Bayes, multinomial naïve Bayes, average one-dependence estimators (AODE), Bayesian belief network (BNN), Bayesian networks), clustering algorithms (e.g., k-means, k-medians, expectation maximization (EM), hierarchical clustering), association rule learning algorithms (e.g., perceptron, back-propagation, hopfield network, Radial Basis Function Network (RBFN)), deep learning algorithms (e.g., Deep Boltzmann Machine (DBM), Deep Belief Networks (DBN), Convolutional Neural Network (CNN), Stacked Auto-Encoders), Dimensionality Reduction Algorithms (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Algorithms (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc.

Additional examples of architectures include neural networks such as ResNet50, ResNet101, VGG, DenseNet, PointNet, or the like.

Example Clauses

A: An autonomous vehicle comprising: a vehicle controller comprising: a circuit board; a first graphics processor coupled to the circuit board; a second graphics processor coupled to the circuit board; a battery; and a cooling system comprising: a cooling component having a first side and a second side opposite the first side, the cooling component including an inlet, an outlet, and an internal fluid pathway disposed between the first side, the second side and extending between the inlet and the outlet and through which a cooling fluid is passed, the cooling component configured to transfer heat from the first graphics processor to the cooling fluid and transfer heat from the second graphics processor to the cooling fluid, wherein the first side of the cooling component is thermally coupled to the first graphics processor and the second side of the cooling component is thermally coupled to the second graphics processor; and a cooling fluid source fluidically connected to the cooling system and the battery and configured to provide cooling fluid to the inlet of the cooling component and the battery.

B: The autonomous vehicle of paragraph A, wherein the internal fluid pathway is a first fluid pathway, the autonomous vehicle further comprising: a cooling plate positioned proximate a first side of the first graphics processor opposite a second side of the first graphics processor, the second side of the first graphics processor being thermally coupled to the cooling component, wherein the cooling plate defines a second fluid pathway through which the cooling fluid is passed, wherein the second fluid pathway is separate from the first fluid pathway.

C: The autonomous vehicle of paragraph B, wherein the circuit board defines a first plane, the first graphics processor defines a second plane different from the first plane, and the second graphics processor defines a third plane different from the first plane and the second plane, the first plane being parallel to the second plane and the third plane.

D: The autonomous vehicle of any of paragraphs A-C, wherein the internal fluid pathway is a first fluid pathway, the inlet is a first inlet and the outlet is a first outlet, the first inlet and the first outlet are positioned proximate the first side of the cooling component, the autonomous vehicle further comprising: a second inlet and a second outlet positioned proximate the second side of the cooling component, wherein the cooling component further defines a second fluid pathway separate from the first fluid pathway and associated with the second inlet and the second outlet.

E: The autonomous vehicle of any of paragraphs A-D, wherein the internal fluid pathway is a first fluid pathway, the first graphics processor is disposed proximate a first portion of the first side of the cooling component, the second graphics processor is disposed proximate a first portion of the second side of the cooling component the autonomous vehicle further comprising: a third graphics processor thermally coupled to the first side of the cooling component and disposed proximate a second portion of the first side of the cooling component different from the first portion of the first side of the cooling component; and a fourth graphics processor thermally coupled to the second side of the cooling component and disposed proximate a second portion of the second side of the cooling component different from the first portion of the second side of the cooling component, wherein the cooling component further defines a second fluid pathway to the first fluid pathway through which the cooling fluid is passed simultaneously at the first fluid pathway and the second fluid pathway, the first fluid pathway being associated with the first portion of the first side of the cooling component and the first portion of the second side of the cooling component and the second fluid pathway being associated with the second portion of the first side of the cooling component and the second portion of the second side of the cooling component.

F: A system comprising: a cooling component having a first side and a second side opposite the first side, the cooling component defining a fluid pathway through which a cooling fluid is passed, the fluid pathway extending from an inlet to an outlet and being disposed between the first side and the second side and comprises: a first cooling region coupled to the fluid pathway, the first cooling region configured to transfer heat from a first computing component to the cooling fluid; and a second cooling region coupled to the fluid pathway, the second cooling region configured to transfer heat from a second computing component to the cooling fluid; the first computing component positioned proximate the first side of the cooling component, the first computing component having a first processing unit; and the second computing component positioned proximate the second side of the cooling component, the second computing component having a second processing unit.

G: The system of paragraph F, further comprising: a cooling plate positioned proximate a first side of the first computing component opposite a second side of the first computing component, the second side of the first computing component being thermally coupled to the cooling component.

H: The system of paragraph G, wherein the fluid pathway is a first fluid pathway and the cooling plate defines a second fluid pathway through which the cooling fluid is passed, wherein the second fluid pathway is separate from the first fluid pathway.

I: The system of any of paragraphs F-H, wherein the inlet is a first inlet and the outlet is a first outlet, the first inlet and the first outlet are positioned proximate the first side of the cooling component, the system further comprising: a second inlet and a second outlet positioned proximate the second side of the cooling component.

J: The system of paragraph I, wherein the first cooling region having a geometry shaped to maximize a thermal transfer within the first cooling region.

K: The system of any of paragraphs F-J, wherein the fluid pathway is a first fluid pathway and is associated with the first computing component and the second computing component, the system further comprising: a third computing component thermally coupled to the first side of the cooling component; and a fourth computing component thermally coupled to the second side of the cooling component, wherein the cooling component further defines a second fluid pathway associated with the third computing component and the fourth computing component through which the cooling fluid is passed simultaneously at the first fluid pathway and the second fluid pathway.

L: The system of paragraph K, wherein the first computing component is disposed proximate a first portion of the first side of the cooling component, the second computing component is disposed proximate a first portion of the second side of the cooling component, the third computing component is disposed proximate a second portion of the first side of the cooling component different from the first portion of the first side of the cooling component, and the fourth computing component is disposed proximate a second portion of the second side of the cooling component different from the first portion of the second side of the cooling component.

M: A system of any of paragraphs F-L, further comprising a circuit board, wherein the first computing component and the second computing component are electrically connected to the circuit board, wherein the circuit board defines a first plane, the first computing component defines a second plane different from the first plane, the second computing component defines a third plane different from the first plane and the second plane, the first plane being parallel to the second plane and the third plane.

N: The system of paragraph M, wherein the first computing component further comprises a first connector configured to receive a first mating receptacle parallel to the second plane and the circuit board further comprises a second mating receptacle configured to receive a second connector in an orientation nonparallel to the first plane, the system further comprising: a cable comprising the first mating receptacle and the second connector.

O: The system of any of paragraphs F-N, further comprising a cooling fluid source fluidically coupled to at least one of the inlet or the outlet and configured to store the cooling fluid.

P: A vehicle controller comprising: a cooling component having a first side and a second side opposite the first side, the cooling component defining a fluid pathway through which a cooling fluid is passed, the fluid pathway extending from an inlet to an outlet and being disposed between the first side and the second side and comprises: a first cooling region coupled to the fluid pathway, the first cooling region configured to transfer heat from a first computing component to the cooling fluid; and a second cooling region coupled to the fluid pathway, the second cooling region configured to transfer heat from a second computing component to the cooling fluid; the first computing component positioned proximate the first side of the cooling component, the first computing component having a first processing unit; and the second computing component positioned proximate the second side of the cooling component, the second computing component having a second processing unit.

Q: The vehicle controller of paragraph P, further comprising: a cooling plate positioned proximate a first side of the first computing component opposite a second side of the first computing component, the second side of the first computing component being thermally coupled to the cooling component.

R: The vehicle controller of paragraph Q, wherein the fluid pathway is a first fluid pathway and the cooling plate defines a second fluid pathway through which the cooling fluid is passed, wherein the second fluid pathway is separate from the first fluid pathway.

S: The vehicle controller of any of paragraphs P-R, wherein the fluid pathway is a first fluid pathway and is associated with the first computing component and the second computing component, the vehicle controller further comprising: a third computing component thermally coupled to the first side of the cooling component; and a fourth computing component thermally coupled to the second side of the cooling component, wherein the cooling component further defines a second fluid pathway associated with the third computing component and the fourth computing component through which the cooling fluid is passed simultaneously at the first fluid pathway and the second fluid pathway.

T: The vehicle controller of any of paragraphs P-S, further comprising a circuit board, wherein the first computing component and the second computing component are electrically connected to the circuit board, wherein the circuit board has a first plane, the first computing component has a second plane different from the first plane, the second computing component has a third plane different from the first plane and the second plane, the first plane being parallel to the second plane and the third plane.

Conclusion

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples may be used and that changes or alterations, such as structural changes, may be made. Such examples, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. An autonomous vehicle comprising:
a vehicle controller comprising:
a circuit board;
a first graphics processor coupled to the circuit board;
a second graphics processor coupled to the circuit board;
a battery; and
a cooling system comprising:
a cooling component having a first side and a second side opposite the first side, the cooling component including an inlet, an outlet, and an internal fluid pathway disposed between the first side, the second side and extending between the inlet and the outlet and through which a cooling fluid is passed, the cooling component configured to transfer heat from the first graphics processor to the cooling fluid and transfer heat from the second graphics processor to the cooling fluid,
wherein the first side of the cooling component is thermally coupled to the first graphics processor, the second side of the cooling component is thermally coupled to the second a graphics processor, and the cooling component is disposed in a sandwich configuration between the first graphics processor and the second graphics processor; and
a cooling fluid source fluidically connected to the cooling system and the battery and configured to provide cooling fluid to the inlet of the cooling component and the battery.

2. The autonomous vehicle of claim 1, wherein the internal fluid pathway is a first fluid pathway, the autonomous vehicle further comprising:

a cooling plate positioned proximate a first side of the first graphics processor opposite a second side of the first graphics processor, the second side of the first graphics processor being thermally coupled to the cooling component, wherein the cooling plate defines a second fluid pathway through which the cooling fluid is passed, wherein the second fluid pathway is separate from the first fluid pathway.

3. The autonomous vehicle of claim 2, wherein the circuit board defines a first plane, the first graphics processor defines a second plane different from the first plane, and the second graphics processor defines a third plane different from the first plane and the second plane, the first plane being parallel to the second plane and the third plane.

4. The autonomous vehicle of claim 1, wherein the internal fluid pathway is a first fluid pathway, the inlet is a first inlet and the outlet is a first outlet, the first inlet and the first outlet are positioned proximate the first side of the cooling component, the autonomous vehicle further comprising:

a second inlet and a second outlet positioned proximate the second side of the cooling component, wherein the cooling component further defines a second fluid pathway separate from the first fluid pathway and associated with the second inlet and the second outlet.

5. The autonomous vehicle of claim 1, wherein the internal fluid pathway is a first fluid pathway, the first graphics processor is disposed proximate a first portion of the first side of the cooling component, the second graphics processor is disposed proximate a first portion of the second side of the cooling component the autonomous vehicle further comprising:

a third graphics processor thermally coupled to the first side of the cooling component and disposed proximate a second portion of the first side of the cooling component different from the first portion of the first side of the cooling component; and a fourth graphics processor thermally coupled to the second side of the cooling component and disposed proximate a second portion of the second side of the cooling component different from the first portion of the second side of the cooling component, wherein the cooling component further defines a second fluid pathway to the first fluid pathway through which the cooling fluid is passed simultaneously at the first fluid pathway and the second fluid pathway, the first fluid pathway being associated with the first portion of the first side of the cooling component and the first portion of the second side of the cooling component and the second fluid pathway being associated with the second portion of the first side of the cooling component and the second portion of the second side of the cooling component.

6. A system comprising:

a cooling component having a first side and a second side opposite the first side, the cooling component defining a fluid pathway through which a cooling fluid is passed, the fluid pathway extending from an inlet to an outlet and being disposed between the first side and the second side and comprises:

a first cooling region coupled to the fluid pathway, the first cooling region configured to transfer heat from a first computing component to the cooling fluid; and a second cooling region coupled to the fluid pathway, the second cooling region configured to transfer heat from a second computing component to the cooling fluid;

the first computing component positioned proximate the first side of the cooling component, the first computing component having a first processing unit; and the second computing component positioned proximate the second side of the cooling component, the second computing component having a second processing unit, wherein the cooling component is disposed between the first computing component and the second computing component in a sandwich configuration.

7. The system of claim 6, further comprising:

a cooling plate positioned proximate a first side of the first computing component opposite a second side of the first computing component, the second side of the first computing component being thermally coupled to the cooling component.

8. The system of claim 7, wherein the fluid pathway is a first fluid pathway and the cooling plate defines a second fluid pathway through which the cooling fluid is passed, wherein the second fluid pathway is separate from the first fluid pathway.

9. The system of claim 6, wherein the inlet is a first inlet and the outlet is a first outlet, the first inlet and the first outlet are positioned proximate the first side of the cooling component, the system further comprising:

a second inlet and a second outlet positioned proximate the second side of the cooling component.

10. The system of claim 9, wherein the first cooling region having a geometry shaped to maximize a thermal transfer within the first cooling region, the geometry comprising at least one of fins, columns, and scored surfaces.

11. The system of claim 6, wherein the fluid pathway is a first fluid pathway and is associated with the first computing component and the second computing component, the system further comprising:

a third computing component thermally coupled to the first side of the cooling component; and a fourth computing component thermally coupled to the second side of the cooling component, wherein the cooling component further defines a second fluid pathway associated with the third computing component and the fourth computing component through which the cooling fluid is passed simultaneously at the first fluid pathway and the second fluid pathway.

12. The system of claim 11, wherein the first computing component is disposed proximate a first portion of the first side of the cooling component, the second computing component is disposed proximate a first portion of the second side of the cooling component, the third computing component is disposed proximate a second portion of the first side of the cooling component different from the first portion of the first side of the cooling component, and the fourth computing component is disposed proximate a second portion of the second side of the cooling component different from the first portion of the second side of the cooling component.

13. A system of claim 6, further comprising a circuit board, wherein the first computing component and the second computing component are electrically connected to the circuit board, wherein the circuit board defines a first plane, the first computing component defines a second plane different from the first plane, the second computing component defines a third plane different from the first plane and the second plane, the first plane being parallel to the second plane and the third plane.

14. The system of claim 13, wherein the first computing component further comprises a first connector configured to receive a first mating receptacle parallel to the second plane and the circuit board further comprises a second mating receptacle configured to receive a second connector in an orientation nonparallel to the first plane, the system further comprising:

a cable comprising the first mating receptacle and the second connector.

15. The system of claim 6, further comprising a cooling fluid source fluidically coupled to at least one of the inlet or the outlet and configured to store the cooling fluid.

16. A vehicle controller comprising:

a cooling component having a first side and a second side opposite the first side, the cooling component defining a fluid pathway through which a cooling fluid is passed, the fluid pathway extending from an inlet to an outlet and being disposed between the first side and the second side and comprises:

a first cooling region coupled to the fluid pathway, the first cooling region configured to transfer heat from a first computing component to the cooling fluid; and a second cooling region coupled to the fluid pathway, the second cooling region configured to transfer heat from a second computing component to the cooling fluid;

the first computing component positioned proximate the first side of the cooling component, the first computing component having a first processing unit; and the second computing component positioned proximate the second side of the cooling component, the second computing component having a second processing unit, wherein based at least in part on the first computing component being positioned proximate the first side and the second computing component being positioned proximate the second side, the cooling component is positioned between the first computing component and the second computing component.

17. The vehicle controller of claim 16, further comprising:

a cooling plate positioned proximate a first side of the first computing component opposite a second side of the first computing component, the second side of the first computing component being thermally coupled to the cooling component.

18. The vehicle controller of claim 17, wherein the fluid pathway is a first fluid pathway and the cooling plate defines a second fluid pathway through which the cooling fluid is passed, wherein the second fluid pathway is separate from the first fluid pathway.

19. The vehicle controller of claim 16, wherein the fluid pathway is a first fluid pathway and is associated with the first computing component and the second computing component, the vehicle controller further comprising:

a third computing component thermally coupled to the first side of the cooling component; and a fourth computing component thermally coupled to the second side of the cooling component, wherein the cooling component further defines a second fluid pathway associated with the third computing component and the fourth computing component through which the cooling fluid is passed simultaneously at the first fluid pathway and the second fluid pathway.

20. The vehicle controller of claim 16, further comprising a circuit board, wherein the first computing component and the second computing component are electrically connected to the circuit board, wherein the circuit board has a first plane, the first computing component has a second plane different from the first plane, the second computing component has a third plane different from the first plane and the second plane, the first plane being parallel to the second plane and the third plane.

* * * * *